(12) United States Patent
Shoji et al.

(10) Patent No.: US 7,358,165 B2
(45) Date of Patent: *Apr. 15, 2008

(54) SEMICONDUCTOR DEVICE AND METHOD FOR MANUFACTURING SEMICONDUCTOR DEVICE

(75) Inventors: Hironobu Shoji, Tokyo (JP); Akihisa Shimomura, Kanagawa (JP); Masaki Koyama, Kanagawa (JP)

(73) Assignee: Semiconductor Energy Laboratory Co., Ltd, Kanagawa-ken (JP)

( * ) Notice: Subject to any disclaimer, the term of this patent is extended or adjusted under 35 U.S.C. 154(b) by 36 days.

This patent is subject to a terminal disclaimer.

(21) Appl. No.: 10/887,509

(22) Filed: Jul. 9, 2004

(65) Prior Publication Data

US 2005/0023531 A1 Feb. 3, 2005

(30) Foreign Application Priority Data

Jul. 31, 2003 (JP) .............................. 2003-284437

(51) Int. Cl.
H01L 21/20 (2006.01)
(52) U.S. Cl. ............... 438/487; 438/149; 257/E21.133; 257/E21.134
(58) Field of Classification Search ............... 438/149, 438/487; 257/E21.133, E21.134
See application file for complete search history.

(56) References Cited

U.S. PATENT DOCUMENTS

| | | | |
|---|---|---|---|
| 5,543,352 A | 8/1996 | Ohtani et al. | |
| 5,569,610 A | 10/1996 | Zhang et al. | |
| 5,612,250 A | 3/1997 | Ohtani et al. | |
| 5,621,224 A | 4/1997 | Yamazaki et al. | |
| 5,712,191 A | 1/1998 | Nakajima et al. | |
| 5,756,364 A | 5/1998 | Tanaka et al. | |
| 5,795,795 A | 8/1998 | Kousai et al. | |
| 5,824,573 A | 10/1998 | Zhang et al. | |
| 5,858,823 A | 1/1999 | Yamazaki et al. | |
| 5,879,977 A | 3/1999 | Zhang et al. | |
| 6,110,770 A | 8/2000 | Zhang et al. | |
| 6,143,661 A | 11/2000 | Kousai et al. | |
| 6,190,949 B1 | 2/2001 | Noguchi et al. | |
| 6,232,156 B1 | 5/2001 | Ohtani et al. | |
| 6,319,761 B1 | 11/2001 | Zhang et al. | |
| 6,331,457 B1 | 12/2001 | Yamazaki et al. | |

(Continued)

FOREIGN PATENT DOCUMENTS

| | | |
|---|---|---|
| JP | 07-161634 | 6/1995 |
| JP | 10-41234 | 2/1998 |
| JP | 2001-223219 | 8/2001 |
| JP | 2002-203789 | 7/2002 |

OTHER PUBLICATIONS

U.S. Appl. No. 10/896,007, filed Jul. 22, 2004, "Laser Irradiation Method, Laser Irradiation Apparatus . . . " (Specification, Claims, Drawings and Abstract).

(Continued)

*Primary Examiner*—Andy Huynh
(74) *Attorney, Agent, or Firm*—Nixon Peabody LLP; Jeffrey L. Costellia

(57) ABSTRACT

A crystallizing method that can control the orientation of crystal grains with the use of a metal element for promoting crystallization. In the method, the metal element for promoting crystallization is added to selectively form a crystalline semiconductor film, and the crystalline semiconductor film is irradiated with a pulsed laser to form a film having small crystal grains in grid pattern at a regular intervals wherein adjacent crystal grains have the same orientation.

44 Claims, 14 Drawing Sheets

U.S. PATENT DOCUMENTS

| | | | |
|---|---|---|---|
| 6,335,541 B1 * | 1/2002 | Ohtani et al. | 257/59 |
| 6,451,638 B1 | 9/2002 | Zhang et al. | |
| 6,479,329 B2 | 11/2002 | Nakajima et al. | |
| 6,548,830 B1 | 4/2003 | Noguchi et al. | |
| 6,777,713 B2 | 8/2004 | Mayairi et al. | |
| 6,828,179 B2 * | 12/2004 | Yamazaki et al. | 438/166 |
| 6,890,840 B2 * | 5/2005 | Isobe et al. | 438/487 |
| 2003/0122129 A1 | 7/2003 | Yamazaki et al. | |
| 2003/0143375 A1 | 7/2003 | Noguchi et al. | |
| 2004/0259389 A1 | 12/2004 | Yamazaki et al. | |
| 2004/0266147 A1 | 12/2004 | Shimomura et al. | |
| 2004/0266223 A1 | 12/2004 | Tanaka et al. | |
| 2005/0026401 A1 * | 2/2005 | Shimomura et al. | 438/487 |
| 2005/0208710 A1 | 9/2005 | Isobe et al. | |

OTHER PUBLICATIONS

U.S. Appl. No. 10/900,463, filed Jul. 28, 2004, "Method For Manufacturing Semiconductor . . . " (Specification, Claims, Drawings and Abstract).

Y. Nakata et al., TFT3-3, "Crystallization of an a-Si film by a Nd:YAG pulse laser beam with linear polarization", AM-LCD 2000, Jul. 12-14, 2000, pp. 265-268.

Oron.M, Applied Physics Letters, "New Experimental Evidence of the Periodic Surface Structure in Laser Annealing", vol. 35, No. 10, pp. 782-784 Nov. 15, 1979.

Fauchet.P, Applied Physics Letters, "Surface Ripples on Silicon and Gallium Arsenide Under Picosecond Laser Illumination", vol. 40, No. 9, pp. 824-826 May 1, 1982.

* cited by examiner $\lambda$ :Crystal grain size island-shaped semiconductor film
202
201 island-shaped semiconductor film
202
201 selectively-doped region | non-doped region | selectively-doped region irradiated region selectively-doped region | entirely-doped region | selectively-doped region irradiated region non-irradiated region | irradiated region | non-irradiated region semiconductor film

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device having a thin film transistor formed using a crystalline semiconductor film of high crystallinity. The present invention also relates to a crystallizing method for manufacturing thereof.

2. Related Art

Recently, a research has been advanced concerning a sophisticated semiconductor device using a thin film transistor. Particularly in the semiconductor device requiring rapidity and high functionality, it is necessary to obtain the thin film transistor (hereinafter also referred to as TFT) having high mobility.

In order to enhance the crystallinity of the semiconductor film, the crystallization is performed to form a crystalline semiconductor film in such a way that a metal element for promoting the crystallization typified by nickel element (Ni) is added, formed, or coated to the semiconductor film, and then a heat treatment is performed thereto (for example, refer to patent document 1).

When the metal element for promoting the crystallization typified by Ni is used in a such crystallizing step, it is possible to obtain the crystalline semiconductor film having a large grain size and to obtain the crystalline semiconductor film in which the grain boundaries are likely to unite, thereby having fewer defects in the grain.

In addition, as the different crystallizing method from the heat treatment, a crystallizing method by a laser irradiation has been studied. The crystallization by the laser irradiation is conventionally performed in such a way that an ultraviolet beam is irradiated in a pulse oscillation to an amorphous or poly-crystalline silicon layer to form a silicon thin film including a group of silicon single crystal grains (refer to patent document 2, for example). In the laser crystallization according to the patent document 2, the travel distance of a rectangular ultraviolet beam between the position where it ends to be irradiated and the position where it begins to be irradiated next is set to 40 µm or less and the proportion of the travel distance with respect to the width of the ultraviolet beam measured along the moving direction is set in the range of 0.1 to 5%. The patent document 2 discloses that the silicon single crystal grain to be obtained has the preferred orientation approximately <100> to the surface of the base substance.

It is reported that when the polarized laser light is used in the crystallization, a ridge is formed in the direction perpendicular to the direction of polarization by optimizing the condition at the laser irradiation (refer to non-patent document 1). The non-patent document 1 describes that the interval between the ridges depends on the wavelength and the irradiation angle of the laser light, which is expressed with $\lambda/(1 \pm \sin \theta)$ in p-polarized laser light where $\lambda$ is the wavelength of the laser light and $\theta$ is the irradiation angle of the laser light.

The non-patent document 1 discloses in FIG. 2A that the first irradiation of the linear pulsed laser forms a linear ridge. Moreover, the non-patent document 1 discloses in FIG. 2B that the second irradiation of the linear pulsed laser light at an angle 90° with respect to the direction of the first laser irradiation forms a grid pattern of the ridge.

The non-patent document 1 reports an experiment where an amorphous silicon film formed over a glass substrate is irradiated with a pulsed Nd: YAG laser in a film-forming chamber of ultra high vacuum in which the temperature is set to be the same as that of the substrate, which is 350° C.

[Patent Document 1]
Unexamined Patent Publication H7-161634 bulletin

[Patent Document 2]
Unexamined Patent Publication H10-41234 bulletin

[Non-Patent Literature 1]
"AM-LCD 2000", p. 265-268 written by Y. Nakata, A. Shimoyama, and S. Horita, In the crystallizing method according to patent document 1, many aggregations of pillar crystals (each aggregation is also referred to as a domain) having a large size from 200 to 300 µm are formed. The crystals in one domain have the same crystal orientation. However, the orientation is different in the adjacent domains, and they have a boundary therebetween. When a TFT is manufactured by forming a channel-forming region within one domain, high electrical characteristic can be obtained.

However, the domain is formed at random and it is difficult to form the channel-forming region within one domain. Therefore, it becomes difficult to form all the channel-forming regions which are arranged in a pixel portion and a driver circuit portion respectively within one domain.

As a result, although there is an advantage of high mobility when such a crystalline semiconductor film is used as an active layer of TFT (an island-shaped semiconductor film including a channel-forming region and an impurity region), there is a risk of a small difference, which is the variation, in the characteristic between respective TFTs due to the absence or presence of the boundary between the adjacent domains (the domains having the different orientation) in the channel-forming region or due to the difference of the size of the domain to be formed.

The variation in the electrical characteristic of TFT arranged in the pixel portion or the driver circuit portion causes the variation in the current and the voltage applied to each pixel electrode, which becomes the display unevenness that is visible for the observer.

At present, this variation is acceptable and it does not lead to any problems. In the future, however, when the pixel size is miniaturized further and the more precise image is demanded, this variation is considered to become a serious problem. In the future, as the width of the gate wiring becomes narrower, the size of the channel-forming region (channel width) becomes smaller. Therefore, there is a risk that a TFT having a boundary between the domains in the channel-forming region is formed. The characteristic of such a TFT (mobility, S-value, on-current, off-current, and the like) varies compared with that of TFT having a channel-forming region with no boundaries, and therefore this variation is considered to cause the display unevenness.

According to crystallizing method disclosed in the patent document 2, the travel distance of a rectangular ultraviolet beam between the position where it ends to be irradiated and the position where it begins to be irradiated next is set to 40 µm or less, and the proportion of the travel distance with respect to the width of the ultraviolet beam measured along the moving direction is set in the range of 0.1 to 5%. In the embodiment 1 of the patent document 2, any point in the amorphous silicon layer is irradiated with the pulsed ultraviolet laser 100 times.

Since the laser is irradiated to the silicon layer many times, for example 100 times, in such a crystallizing method, the processing takes much time.

In particular, when the crystalline semiconductor film formed by controlling the orientation with the use of a metal such as Ni is irradiated with the laser many times, it is impossible to maintain its orientation. In other words, when the laser light is irradiated many times as shown in the conditions described in the patent document 2 after forming the crystalline semiconductor film with the orientation controlled using the metal element as shown in the patent document 1, it is impossible to maintain the crystalline semiconductor film with the orientation controlled.

In addition, as shown in the non-patent document 1, the ridge forms a grid pattern only when the second laser irradiation is performed at an angle 90° with respect to the direction of the first laser irradiation under the conditions where the Nd: YAG laser is irradiated in a vacuum film-forming chamber with the substrate temperature set to 350° C. Therefore, in such a method, the laser irradiation takes much time. This means it takes much time to manufacture a semiconductor device or a thin film transistor, and therefore this method is unsuitable for mass production.

SUMMARY OF THE INVENTION

Consequently, it is an object of the present invention to provide a method for manufacturing a crystalline semiconductor film comprising the steps of crystallizing a semiconductor film using metal contain material for promoting the crystallization while controlling an orientation, and irradiating pulsed laser once to a crystalline semiconductor film with the orientation controlled so as to form a crystalline semiconductor film having small crystal grains arranged at regular intervals in a grid pattern with the orientation aligned in the adjacent crystal grains. And another object of the present invention is to provide a crystalline semiconductor film manufactured by the above method. And it is also an object of the present invention to provide a thin film transistor having such a crystalline semiconductor film and to provide a method for manufacturing the thin film transistor. Furthermore, it is also an object of the present invention to provide a semiconductor device having the thin film transistor and to provide a method for manufacturing the semiconductor device.

In the present invention made in view of the above problems, a crystalline semiconductor film having crystal grains formed in order with an orientation aligned in the adjacent crystal grains is formed by irradiating the laser of pulsed oscillation (hereinafter referred to as a pulsed laser) to an amorphous semiconductor film. Moreover, in the present invention, a thin film transistor is formed using the above crystalline semiconductor film. In the present invention, it is preferable that a metal element for promoting the crystallization (hereinafter also referred to as the metal element simply) is added selectively to the amorphous semiconductor film to form the crystalline semiconductor film and then a pulsed laser is irradiated.

It is noted that one kind or plural kinds of the metal elements selected from the group consisting of nickel (Ni), iron (Fe), cobalt (Co), palladium (Pd), platinum (Pt), copper (Cu), gold (Au), silver (Ag) indium (In), and tin (Sn) can be used in the present invention.

It is noted that the crystalline semiconductor film with the crystal grains formed in order means the crystalline semiconductor film in which the ridges form a grid pattern and the crystal grain is formed between the ridges by irradiating the pulsed laser to the amorphous semiconductor film. The term "ridge" herein used means a convex portion, which is an uplifted portion of a film formed irregularly in the position where the crystal grains collide each other. That the ridges form a grid pattern means that the ridges form a grid pattern in the most part of the region where particularly the thin film transistor is formed and it is not necessary for the ridges to form a grid pattern in the whole crystalline semiconductor film.

Particularly, in the present invention, the size of the crystal grain, which is the interval between the ridges, is almost equal to the emission wavelength (hereinafter also referred to as wavelength simply) of the pulsed laser light irradiated to the crystalline semiconductor film. And, the size of the crystal grain is controlled by the wavelength of the pulsed laser. Moreover, the size of the crystal grain may be controlled by the incidence angle $\theta$ of the pulsed laser irradiated to the crystalline semiconductor film. It is noted that the incidence angle $\theta$ is set so as to satisfy the inequality of $0°<\theta<90°$, preferably the inequality of $20°\leq\theta\leq45°$.

And the present invention can have the ridges form a grid pattern by irradiating the pulsed laser once. Irradiating the pulsed laser once means scanning the pulsed laser once with respect to the amorphous semiconductor film or the crystalline semiconductor film, which is the irradiated object. However, any point in the crystalline semiconductor film irradiated with the laser (any irradiated point) is irradiated with the pulsed laser for a plurality of shots. For example, when the semiconductor film has a thickness of approximately 50 nm, the pulsed excimer laser is irradiated under the conditions with the energy density set in the range of 350 to 450 m J/cm$^2$ and the number of shots set in the range of 20 to 40.

In the present invention, the pulsed laser is preferably shaped into linear using an optical system. It is noted that the term "linear" herein used does not mean a line strictly but means a rectangle (or an oblong) having a large aspect ratio. For example, the rectangular shape having an aspect ratio of 2 or more (preferably in the range of 10 to 10000) is referred to as linear though the linear is still included in the rectangular. As a result, a large area can be irradiated, thereby enhancing the mass productivity.

As the pulsed laser, it is possible to use an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: Sapphire laser, a copper vapor laser, or a gold vapor laser in the present invention.

In the case of performing the crystallization using the metal element for promoting the crystallization as the present invention, when the metal element adversely affects the electrical characteristic of TFT, it is necessary to remove or to decrease the metal element. In removing or decreasing the metal element, gettering process is used.

In the present invention, the laser irradiation segregates the metal element typified by Ni in the ridge. Therefore, when the gettering is performed, the metal element can be gettered in a gettering sink efficiently. In particular, the gettering is preferably performed in such a way that the semiconductor film with the noble gas added is formed as the gettering sink on the crystalline semiconductor film with the ridge formed after the laser irradiation. In other words, since all the metal elements typified by Ni segregate in the ridge, which is the tip of the crystalline semiconductor film, the gettering efficiency can be increased by forming the gettering sink in the closest position to the ridge. These gettering sinks need to be removed by etching or the like. Alternatively, a predetermined region in the crystalline semiconductor film may be used as the gettering sink. For example, the metal element may be reduced or removed in the region to become the channel regions by using the impurity regions to become source regions or drain regions as the gettering sinks.

In addition, when the crystalline semiconductor film is formed as shown in the present invention, the metal element segregates in the ridge forming a grid pattern, for example in the tip of the ridge. The gettering step can be also performed by removing the ridge using hydrofluoric acid or the like. In that case, it is not necessary to form the gettering sink.

More preferably, the flattening process may be performed to the crystalline semiconductor film.

The crystalline semiconductor film thus formed can be used to form a channel-forming region of the thin film transistor in the crystal grains with orientation aligned. Moreover, it is possible to form the channel-forming region in one of the crystal grains with the orientation aligned, and to form a thin film transistor not having a crystal grain boundary (the crystal boundary formed in the position where the crystals collide due to the crystal growth). On this occasion, a gate electrode may be formed between the adjacent ridges. As a result, it is possible to reduce or avoid the adverse effect in the crystal grain boundary in the channel-forming region.

The pulsed laser may be irradiated separately to the pixel portion and to the driver circuit portion in the semiconductor device having such a thin film transistor. In the pixel portion, moreover, the pulsed laser may be irradiated separately to a capacitance element and to a TFT, particularly a driver TFT connected to a light-emitting element or a liquid crystal element for driving it. Furthermore, the region where the metal element is added may be separated.

[Advantageous Effect of the Invention]

The present invention can provide the crystalline semiconductor film which is formed by controlling the size of the crystal grain, which is the interval between the ridges, and by controlling the crystal orientation according to the pulsed laser irradiation. It is possible to reduce the variation between the thin film transistors formed to have a crystal grain with the crystal orientation aligned, at least between the thin film transistors having a channel-forming region formed in the crystal grain with the orientation aligned. As a result, a semiconductor device having uniform electrical characteristic and having the display unevenness reduced can be manufactured.

In addition, it is possible to reduce or avoid the adverse effect in the crystal grain boundary by forming the thin film transistor in which the channel-forming region is formed in one crystal grain. As a result, the thin film transistor having uniform electrical characteristic and higher mobility can be manufactured.

In addition, according to the present invention, the crystalline semiconductor film formed in the pixel portion and the driver circuit portion of the semiconductor device can be made separately.

DETAILED DESCRIPTION OF THE INVENTION

Figure 1A:
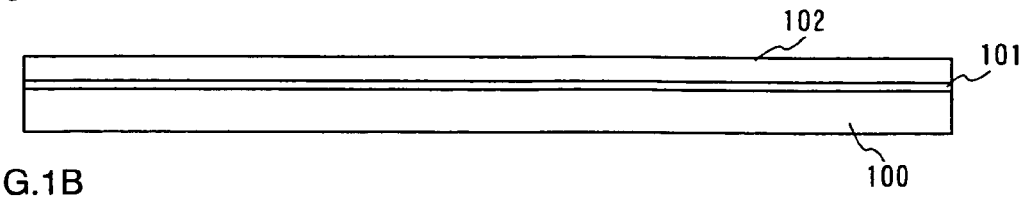
FIGS. 1A to 1G are cross-sectional view which illustrate a method for manufacturing a thin film transistor of the present invention.

Embodiment modes and an embodiment of the present invention are hereinafter explained based on drawings. However, since the present invention can be embodied in many different modes, it is easily understood by those skilled in the art that the modes and the details of the present invention can be changed and modified in various ways unless such changes and modifications depart from the scope and the content of the present invention hereinafter defined. Thus, the present invention is not limited to the description of the embodiment modes and the embodiment. In addition, the same reference numeral is given to the same part or the part having the similar function throughout the drawings for explaining the embodiment modes and the embodiment. And the explanation to such a part shall not be repeated.

Embodiment Modes

Embodiment Mode 1

The present embodiment mode explains a method for manufacturing a crystalline semiconductor film in detail.

Initially, as shown in FIG. 1A, a base film 101 is formed on a substrate 100 having an insulating surface. A glass substrate such as a barium borosilicate glass or an alumino borosilicate glass, a quartz substrate, or an SUS substrate can be used as the substrate 100, for example. In addition, although a substrate made of flexible synthetic resin such as acryl or plastic typified by PET, PES, PEN, or the like tends to be inferior in resistance against the heat to the above substrates, the substrate made of flexible synthetic resin can be used when it can resist the heat generated in the manufacturing process.

The base films 101 are provided in order to prevent that alkali-earth metal or alkali metal such as Na included in the substrate 100 diffuses into the semiconductor film to have an adverse effect characteristic of a semiconductor device. Therefore, each base film is formed of an insulating film such as silicon oxide, silicon nitride, or silicon nitride oxide which can suppress the diffusion of the alkali-earth metal and alkali metal into the semiconductor film. In the present embodiment mode, a silicon nitride oxide film is formed in a thickness from 10 to 400 nm (preferably from 50 to 300 nm). In addition, the base film 101 may have a laminated-layer structure. For example, a silicon oxynitride film (composition ratio: Si=32%, O=27%, N=24%, H=17%) is formed in a thickness from 10 to 200 nm (preferably from 50 to 100 nm) and a silicon oxynitride film (composition ratio: Si=32%, O=59%, N=7%, H=2%) may be laminated thereon in a thickness from 50 to 200 nm (preferably from 100 to 150 nm).

In the case of using the substrate including the alkali metal or the alkali-earth metal in any way such as the glass substrate, the SUS substrate, or the plastic substrate, it is effective to provide the base film in terms of preventing the diffusion of the impurity. When the diffusion of the impurity does not lead to any significant problems, for example when the quartz substrate is used, the base film is not always necessary to be provided.

An amorphous semiconductor film 102 is formed on the base film 101. The film thickness of the amorphous semiconductor film 102 is set in the range of 25 to 100 nm (preferably in the range of 30 to 60 nm). In addition, not only silicon but also silicon germanium can be used as the amorphous semiconductor. In the case of using silicon germanium, the concentration of germanium is preferably in the range of 0.01 to 4.5 atomic %. A silicon-based semiconductor film (also referred to as an amorphous silicon film) having a thickness of 40 nm is used in the present embodiment mode.

Figure 1B:
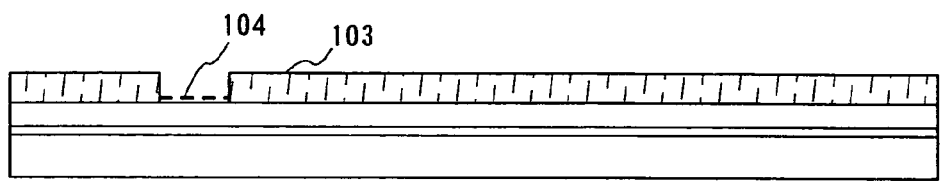

Next, as shown in FIG. 1B, a metal element is added in the amorphous semiconductor film 102. It is noted that adding the metal element means forming the metal element on the surface of the amorphous semiconductor film 102 so that at least the crystallization is promoted. As thus described, the amorphous semiconductor film can be crystallized at low temperature by adding the metal element. Moreover, the orientation of the crystal grain can be controlled to form so-called domain.

On this occasion, a mask 103 is formed in order to add the metal element in the predetermined position. Although the metal element is added all over the substrate thereafter, the metal element is added only to the opening (a window for adding the metal element) of the mask 103 on the amorphous semiconductor film 102.

For example, Ni solution (including aqueous solution and acetic acid medium) is applied selectively on the amorphous semiconductor film 102 by an application method such as a spin coat method or a dip method to form a film 104 including Ni (however, this film is so thin that it may not be observed).

On this occasion, in order to improve wettability of the surface of the amorphous semiconductor film 102 and to coat all over the surface thereof with the Ni solution, it is desirable to form an oxide film (not shown diagrammatically) in a thickness from 10 to 50 Å by UV light radiation in the oxygen atmosphere, by a thermal oxidation method, by a process using ozone water including hydroxyl radical or by a process using hydrogen peroxide. The oxide film may be formed before or after the mask 103 is formed.

Alternatively, Ni can be added to the amorphous semiconductor film in such a way that a Ni ion is injected by an ion implantation process, that the heat treatment is performed in the water vapor atmosphere including Ni, or that the sputtering is performed using Ni material as a target under Ar plasma. In the present embodiment mode, the mask 103 is formed after forming the oxide film, and then the aqueous solution including Ni acetate by 10 ppm is applied by the spin coat method.

Figure 1C:

After that, the amorphous semiconductor film 102 is heated at temperatures ranging from 500 to 550° C. for 2 to 20 hours to crystallize the amorphous semiconductor film so that a crystalline semiconductor film is formed. Through this heat treatment, a crystal grows from the position where Ni is added in the direction indicated by the arrow as shown in FIG. 1C. The size of the crystal grain is large compared with the case in which the crystal grows without forming the mask. Moreover, the orientation of the crystal grain is controlled and what is called domain having the orientation aligned is formed.

In the heat treatment, it is preferable to change the heating temperature gradually. This is because the initial low-temperature heat treatment can extract hydrogen and the like from the amorphous semiconductor film, thereby reducing the roughness of the film in the crystallization. Alternatively, a magnetic field may be applied to crystallize the semiconductor film in combination with its magnetic energy, or a microwave of high output may be also used. In the present embodiment mode, the heat treatment is performed at a temperature of 550° C. for four hours after a heat treatment at a temperature of 500° C. for one hour using a vertical furnace.

Figure 1D:
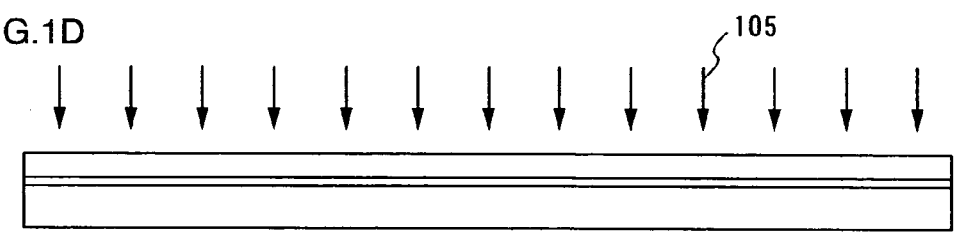

Next, the oxide film formed on the surface of the crystalline semiconductor film is etched away using hydrofluoric acid. Then, after crystallizing the amorphous semiconductor film 102 as shown in FIG. 1D, pulsed laser light 105 is irradiated to the amorphous semiconductor film 102. Although the present embodiment mode explains the case in which the pulsed laser light is irradiated to the amorphous semiconductor film 102 to which the crystallization is performed, the pulsed laser may be irradiated to the amorphous semiconductor film. In other words, the pulsed laser is irradiated to the semiconductor film.

The ridge can form a grid pattern by scanning the pulsed laser light 105 only once to the whole surface of the crystalline semiconductor film. In the present embodiment mode, a pulsed excimer laser (XeCl, emission wavelength 308 nm) is irradiated under conditions with the energy density set to 420 mJ/cm$^2$ and the number of shots set to 25. The linear laser has a size of 400 μm×120 mm.

Figure 1E:
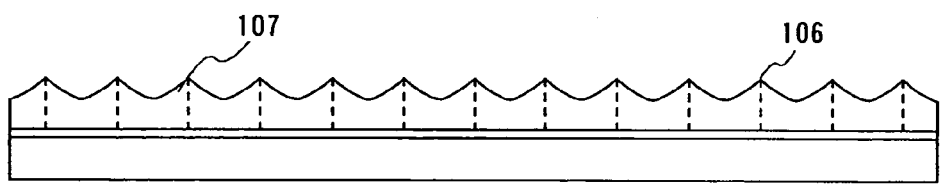

Then, as shown in FIG. 1E, a convex portion 106 referred to as a ridge is formed in order on the surface of the crystalline semiconductor film. The size of the ridge depends upon the conditions in the laser irradiation. Specifically, the size thereof grows as the energy density and the number of shots increase. The ridge is a convex portion, which is an uplifted portion of the film formed irregularly in the position where the crystal grains collide. When the ridges are formed in order, the crystal grains 107 are also formed in order. FIG. 1E is a cross-sectional view typically illustrating the shape of the ridge.

Specifically, the ridges 200 are formed in order, and the crystal grains 201 are also formed in order as shown in FIG.

6. And the adjacent crystal grains have the same orientation and what is called domain 202 is formed.

The interval between the ridges depends on the wavelength of the pulsed laser light 105. In other words, since the excimer laser having an emission wavelength of 308 nm is irradiated in the present embodiment, the interval between the ridges, which is the size of the crystal grain, is approximately 308 nm.

Therefore, when a YLF laser having an emission wavelength of 527 nm is used, the crystalline semiconductor film having a crystal grain size of approximately 527 nm can be obtained.

In addition, when the second harmonic (emission wavelength of 532 nm) of a Nd: YAG laser is used, the crystalline semiconductor film having a crystal grain size of approximately 532 nm can be obtained.

In particular, when the metal element is added in the predetermined position and the heat treatment is performed thereto as in the present embodiment mode, it is possible to enlarge the crystal grain. Therefore, when the pulsed laser having longer wavelength is used, a large crystal grain can be kept.

It is noted that the metal element for promoting the crystallization segregates in the ridge 106. For example, when Ni is used as the metal element to form a crystalline silicon film, nickel silicide ($NiSi_2$, $Ni_3Si_2$, $Ni_2Si$, or the like) is segregated in the ridge. When nickel silicide thus segregates in the ridge of the crystalline silicon film, Ni no longer exists outside the ridge. Therefore, the metal element typified by Ni can be removed efficiently.

Figure 1F:
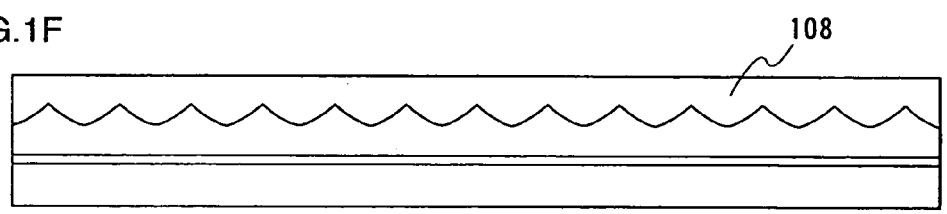

In FIG. 1F, the gettering step is performed in such a way that an amorphous semiconductor film 108 having the inert element, for example Ar, added is formed on the ridge with the metal element segregated and the heat treatment is performed thereto. In addition, the gettering step may be performed with the ridge 106 removed therefrom.

The amorphous semiconductor film 108 can be formed by CVD or sputtering using the target having Si. For example, a high frequency may be applied to the target by operating a high frequency power supply and a magnetic field may be further applied using a permanent magnet in the sputtering apparatus. In addition, an electric power from 0.5 to 3 kW is applied to the target (having a size of 12 inch). It is preferable, on this occasion, to heat the substrate 100 at temperatures from a room temperature (25° C.) to 300° C. Thus, the amorphous semiconductor film 108 to become the gettering sink is formed.

It is more preferable to supply heated Ar gas from above the substrate 100 and to spray it to the surface which is opposite to the surface with the amorphous semiconductor film 108 formed. It is preferable to set the flow rate of Ar gas is in the range of 10 to 50 sccm. Although the processing time needs to be determined in consideration of the deposition condition or the throughput, it is preferable to set in the range of 1 to 20 minutes, preferably for approximately 5 minutes.

It is preferable to form an oxide film when the amorphous semiconductor film 108 is formed on the semiconductor film in order to improve wettability and to prevent the film from being peeled. A thin film (chemical oxide) formed by processing with the use of ozone water or a aqueous solution in which sulfuric acid, hydrochloric acid, or nitric acid is mixed with hydrogen peroxide water can be used as the oxide film. Alternatively, the oxidation may be performed by a plasma treatment in the oxygen atmosphere or by generating ozone through an ultraviolet ray irradiation in the atmosphere including oxygen.

In the present embodiment mode, as shown in FIG. 1E, when the crystalline semiconductor film is irradiated with the laser light, an oxide film is formed on the surface of the semiconductor film. Therefore, the amorphous semiconductor film 108 can be formed utilizing the oxide film without removing the oxide film.

Moreover, the gettering step may be performed in such a way that an impurity element is injected into a part of an impurity region to form a gettering sink, and then a heat treatment is performed thereto.

Since the gettering step is performed after the crystallization by the pulsed laser in the present embodiment mode, the gettering step can be performed after the amorphous condition in the crystalline semiconductor film is reduced. Therefore, the metal element for promoting the crystallization can be gettered in the gettering sink efficiently. It is noted that the pulse laser crystallization may be performed after the gettering step.

Figure 1G:
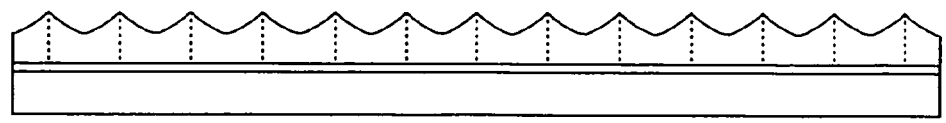

After that, as shown in FIG. 1G, the amorphous semiconductor film 108 is removed by wet etching, dry etching, or by polishing with the use of a CMP (Chemical Mechanical Polishing) method. For example, the amorphous semiconductor film 108 can be removed by wet etching with the use of alkali solution typified by hydrazine or tetramethylammonium hydroxide (TMAH, chemical formula: $(CH_3)_4NOH$)).

Subsequently, the oxide film is removed by wet etching with the use of hydrofluoric acid based etchant. It is preferable that the surface-active agent is included in the hydrofluoric acid based etchant.

In addition, when there is nickel silicide or the like in a channel-forming region, a drain region, or a source region, it becomes a path of current, which causes the increase of the off-current. Therefore, it is important to getter the metal element efficiently in the step for forming the crystalline semiconductor film as the present embodiment mode.

When only the amorphous semiconductor film 108 and the oxide film are removed without removing the ridge 106, the ridge 106 remains. Therefore, a flattening process may be performed to the surface of the crystalline semiconductor film at this time. The embodiment mode 2 may be referred to for the procedure of the flattening process.

Figure 2A:
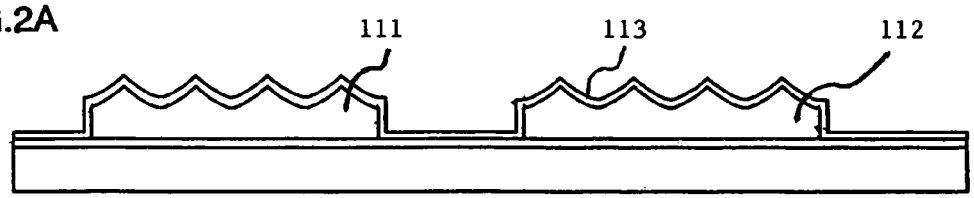
FIGS. 2A to 2E are cross-sectional view which illustrate a method for manufacturing a thin film transistor of the present invention.

The crystalline semiconductor film thus formed is patterned into a predetermined shape as shown in FIG. 2A, thereby forming island-shaped crystalline semiconductor films 111 and 112. It is noted that the present embodiment mode explains the structure where the flattening process is not performed to the crystalline semiconductor film.

Figure 7A:
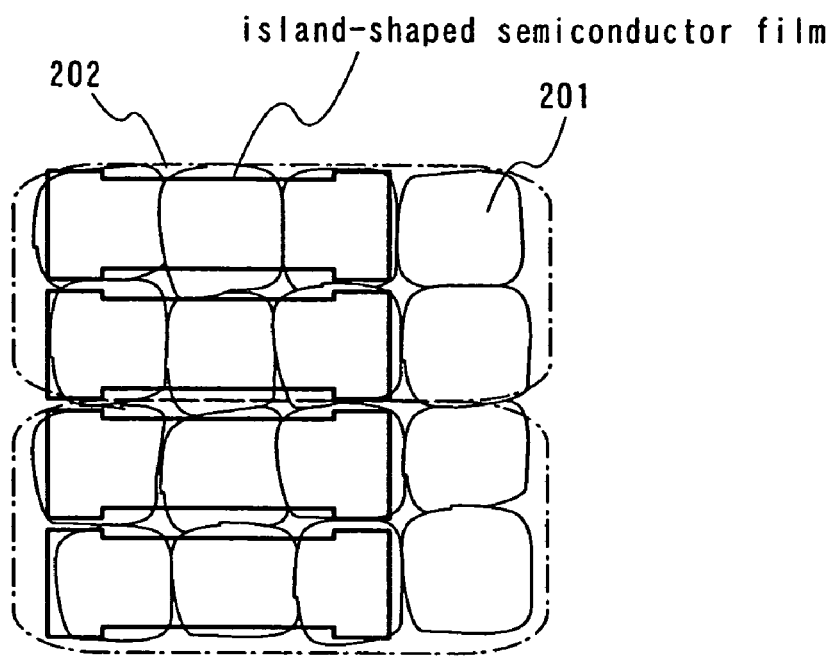
FIGS. 7A and 7B are drawings which illustrate a layout to a crystalline semiconductor film of the present invention.

For example, the crystalline semiconductor film is patterned as shown in FIG. 7A. In FIG. 7A, a channel-forming region is formed within a domain 202. And, a plurality of thin film transistors is formed within the domain 202. Because the orientation is controlled to be aligned in the domain 202, the variation can be decreased.

Figure 7B:
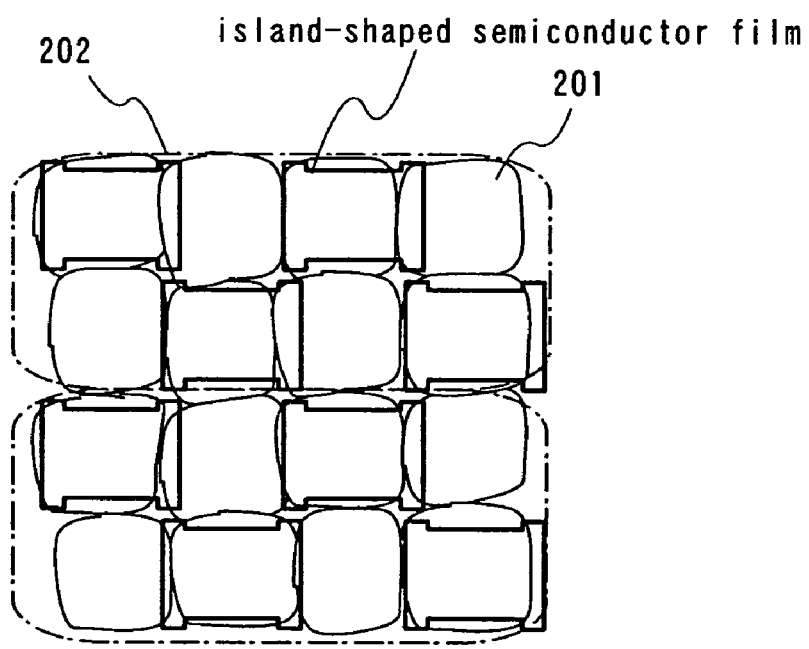

In addition, a channel-forming region may be formed in one crystal grain as shown in FIG. 7B. In this case, because there is no grain boundaries in the channel-forming region, the mobility of the thin film transistor can be expected to increase. Furthermore, the variation is decreased between the plurality of thin film transistors formed within the domain 202. In the cross-sectional view of FIGS. 1A to FIG. 2E, it is noted that, in this case, the semiconductor film is patterned so that the ridge is not included.

And, the surface of the island-shaped crystalline semiconductor films 111 and 112 is washed by the etchant including hydrofluoric acid and a gate insulating film 113 covering the crystalline semiconductor films 111 and 112 is formed. The gate insulating film 113 is formed of an insulating film including silicon in a thickness from 10 to 150 nm by plasma-CVD or sputtering. In the present embodiment mode, a silicon oxynitride film (composition ratio Si=32%, O=59%, N=7%, H=2%) is formed in 115 nm thick by plasma-CVD. Of course, not only the silicon oxynitride film, but also other insulating film including silicon may be used in a single-layer structure or in a laminated-layer structure.

There is a risk that the gate insulating film is cut when the ridge 106 remains in forming the gate insulating film. Therefore, it is preferable to perform the flattening process. The embodiment mode 2 may be referred to for the procedure of the flattening process.

Figure 2B:
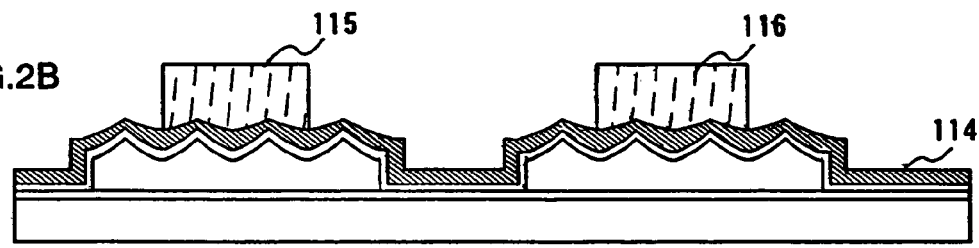

After that, as shown in FIG. 2B, a conductive film 114 to become a gate electrode is formed. The conductive film may be formed of the element selected from the group consisting of Ta, W, Ti, Mo, Al, and Cu, or may be formed of the alloy material or the compound material including the above element as its main component in a single-layer structure or in a laminated-layer structure. In this embodiment mode, the conductive film 114 is formed by forming a tantalum nitride film having a thickness of 50 nm and then forming a tungsten film having a thickness of 370 nm thereon so as to cover the gate insulating film 113.

And, the photosensitive resin is applied by a spin coat method and it is exposed using a stepper to transfer a mask pattern. Then, masks 115 and 116 are formed in a width up to several tens μm. It is noted that the term "width" in this embodiment mode means the width of the channel-forming region in the direction of the channel length. In particular, when TFT having the channel-forming region in one crystal grain, so-called submicron TFT, is formed, the width of the mask is preferable in the range of 0.3 to 1 μm.

Figure 2C:
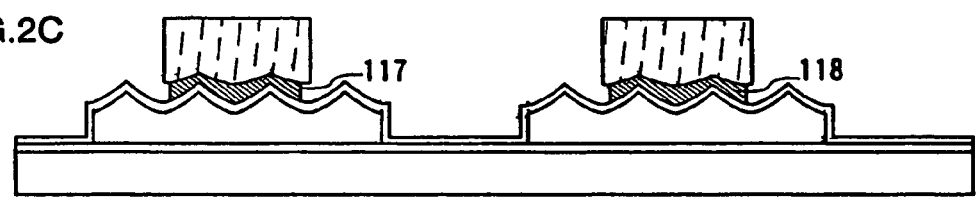

As shown in FIG. 2C, the conductive film 114 is etched using the masks 115 and 116. The etching is performed by means of dry etching or wet etching. In the present embodiment mode, the dry etching is performed using mixed gas of $CF_4$ and $O_2$. And, in some cases, isotropic etching is performed thereto so that the conductive film becomes narrower than the width of the masks 115 and 116, thereby forming gate electrodes 117 and 118. Of course, the conductive film 114 may be etched so as to have the same width as the masks 115 and 116.

In addition, when the gate electrodes 117 and 118 are formed between the adjacent ridges by using the mask having a width from 0.3 to 1 μm, it is possible to form TFT having the channel-forming region in one crystal grain, what is called the submicron TFT. In other words, when the gate electrode is formed thus, the channel-forming region has only one crystal grain having the size almost equal to the wavelength of the pulsed laser. In other words, because there is no crystal grain boundaries in the channel-forming region, the adverse effect in the crystal grain boundaries can be reduced or avoided. As a result, it is possible to manufacture the thin film transistor having higher mobility and uniform electrical characteristic. On this occasion, it is preferable that the width of the gate electrode is in the range of 0.2 to 0.8 μm, that is to say, the width of the channel-forming region is in the range of 0.2 to 0.8 μm, and that the film thickness of the gate insulating film is in the range of 20 to 50 μm.

After that, an impurity element is added using the gate electrodes 117 and 118 as the mask. P (phosphorus) and B (boron) can be used as the impurity element.

Subsequently, it is preferable to form a passivation film including an insulating film such as a silicon oxynitride film or a silicon oxide film on the gate electrodes 117 and 118. After that, the semiconductor film is hydrogenated using a clean oven at temperatures ranging from 300 to 550° C. for 1 to 12 hours.

Figure 2D:
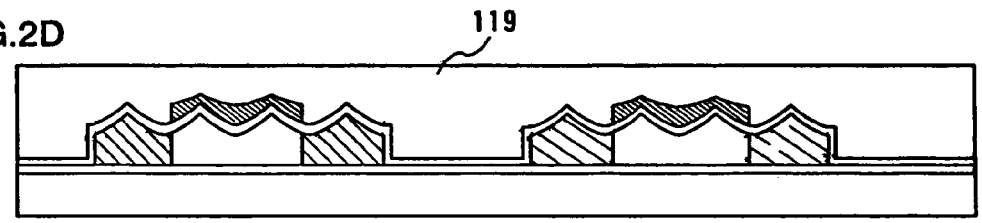

And, as shown in FIG. 2D, an interlayer insulating film 119 is formed on the gate electrodes 117 and 118. The interlayer insulating film 119 can be formed of the insulating film having an inorganic material or an organic material. In the present embodiment mode, the insulating film having silicon oxide is formed in 1.05 μm thick.

Figure 2E:
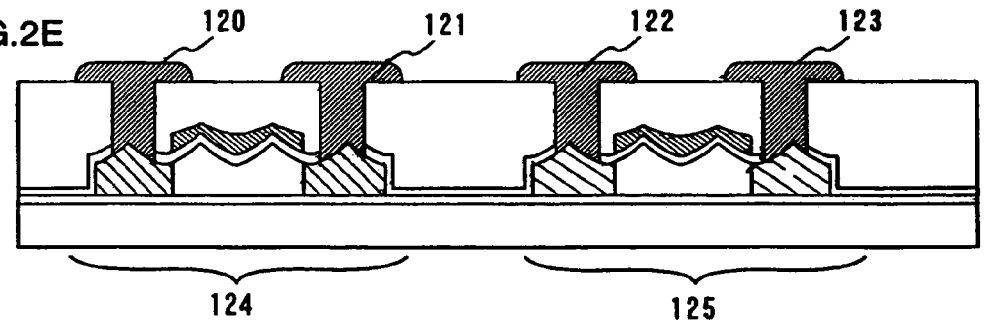

Subsequently, as shown in FIG. 2E, wirings 120 to 123 connected to a source region and a drain region (these wirings are also referred to as a source wiring or a drain wiring) are formed and an n-channel TFT 124 and a p-channel TFT 125 are formed.

Although the present embodiment mode showed the example of TFT structure having the source regions and drain regions, it is also possible to form TFT having an LDD structure and TFT having a GOLD structure.

And, it is possible to manufacture a semiconductor device having the thin film transistor thus formed. The semiconductor device is, for example, the integrated circuit or the semiconductor display device. The thin film transistor can be used particularly in a pixel portion and in a driver circuit portion in the semiconductor display device such as a liquid crystal display device, a light-emitting device having a light-emitting element, typically an organic light-emitting element, equipped in each pixel, a DMD (Digital Micromirror Device), a PDP (Plasma Display Panel), or an FED (Field Emission Display).

Since the present invention can make the crystal grain small, the present invention is preferable for the thin film transistor having a small channel size such as the thin film transistor of CPU having the integrated circuit.

In addition, the crystalline semiconductor film may be made separately in the pixel portion and in the driver circuit portion in the semiconductor display device. The embodiment mode 5 may be referred to for the detail of the step of making it separately. In addition, the crystalline semiconductor film may be made separately in the pixel portion. The embodiment mode 6 may be referred to for the detail of the step of making it separately.

With the above steps, it is possible to provide a thin film transistor having a crystalline semiconductor film in which crystal grains are formed in a grid pattern with the orientation aligned particularly in the adjacent crystal grains and to provide a method for manufacturing the thin film transistor. In the thin film transistor formed to have crystal grains with the orientation aligned in the adjacent crystal grains, at least in the thin film transistor having the channel-forming region formed in the crystal grain with the orientation aligned, the variation between the thin film transistors can be reduced. As a result, it is possible to manufacture the semiconductor device having uniform electrical characteristic and having the display unevenness reduced. Moreover, the channel-forming region may be formed in one of the crystal grains. As a result, the adverse effect in crystal grain boundaries can be reduced or avoided.

Embodiment Mode 2

The present embodiment mode explains the flattening process of the semiconductor film.

When the pulsed laser is irradiated as shown in FIG. 1D, a ridge 106 is formed on a surface of a semiconductor film. When this ridge adversely affects the characteristic of TFT or the like, it is preferable to perform the flattening process.

Figure 5A:
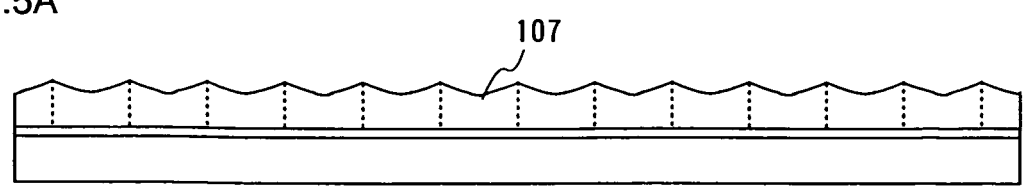
FIGS. 5A to 5C are cross-sectional view which illustrate method for manufacturing a thin film transistor of the present invention.

For example, the flattening process is performed in such a way that after irradiating the pulsed laser in the atmosphere, nitrogen is introduced into a laser irradiation chamber, and the pulsed laser is irradiated. With this step, the ridge can be lowered and the flatness can be enhanced (refer to FIG. 5A). On this occasion, it is necessary to determine the proportion of the concentrations of nitrogen and oxygen carefully because when the laser irradiation chamber contains too much nitrogen, the ridge disappears, which means that the aligned state of the crystal grain formed in a grid pattern may change. As thus described, the flattening process performed while controlling the atmosphere in the laser irradiation chamber does not require the transferring between the chambers, thereby shortening the processing time.

Figure 5B:
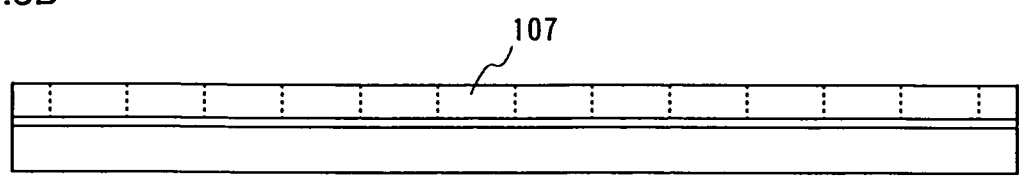

In addition, the flatness can be enhanced by polishing with the use of a CMP (Chemical Mechanical Polishing) method. (refer to FIG. 5B). Alternatively, an etch back using fluorination gas such as $CF_4$ or $NF_3$ may be performed. Moreover, the oxide film formed in the pulsed laser irradiation may be removed through an HF process. Removing the oxide film improves the flatness. In some cases, moreover, the oxide film may be removed with a part of the ridge.

A crystalline semiconductor film having high flatness can be obtained though the flatness depends on the thickness of the crystalline semiconductor film to be removed.

Figure 5C:
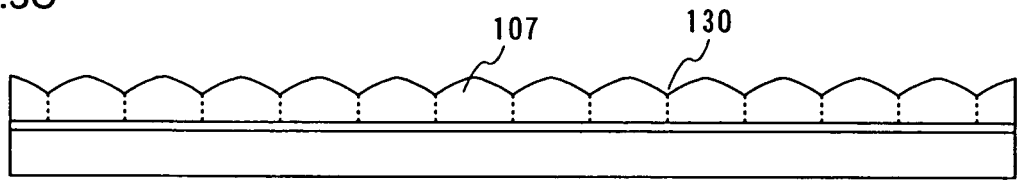
Figure 6:
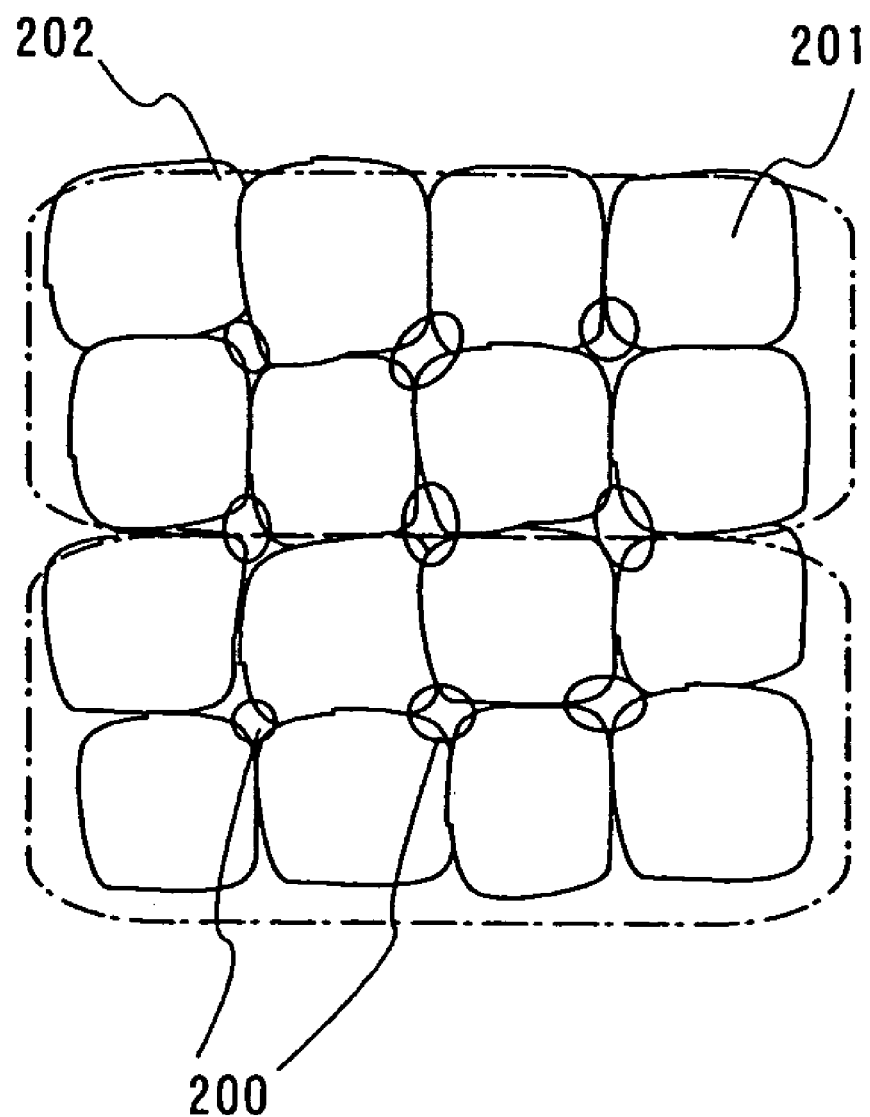
FIG. 6 is a drawing which illustrates a crystalline semiconductor film of the present invention.

In addition, in order to remove the ridge in particular, the wet etching may be performed using the hydrofluoric acid based etchant. It is preferable that the hydrofluoric acid based etchant includes the surface-active agent. When the ridge is removed, a depression (a concave portion) 130 is formed (refer to FIG. 5C). Consequently, the flattening process is preferably performed to the surface of the crystalline semiconductor film with the ridge removed therefrom. For example, the laser light is irradiated in the gas atmosphere with no oxygen existing, which is the inert gas atmosphere. Specifically, the flattening process is performed in such a way that the pulsed excimer laser (XeCl, emission wavelength 308 nm) is irradiated under conditions with the energy density set to 480 mJ/cm$^2$, and the number of shots set to 12.

In the case of forming a thin film transistor in particular, it is preferable to make it flatter by removing the ridge 106 because there is a risk that the electric field may concentrate on the tip of the ridge when the gate voltage is impressed.

Although the above flattening process may have some influence, the crystal grains are still formed in order.

The gettering step can be performed after the flattening process as above. Alternatively, the gettering step may be performed before the flattening process of the ridge.

Thus, it is possible to suppress the roughness of the surface of the semiconductor and to suppress the variation of the threshold value due to the variation of the interface state density.

Of course, when the flatness of the surface of the semiconductor film does not lead to any problems, the flattening process is not necessary.

The present embodiment mode can be freely combined with any one of the present embodiment modes above.

Embodiment Mode 3

The present embodiment mode explains a method for manufacturing a crystalline semiconductor film which is different from the embodiment mode 1.

Figure 3A:
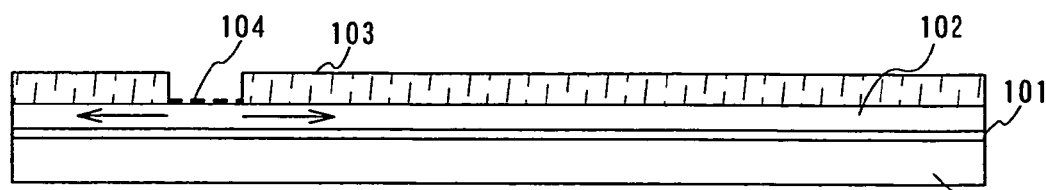
FIGS. 3A to 3D are cross-sectional view which illustrate a method for manufacturing a thin film transistor of the present invention.

In FIG. 3A, a mask 103 is formed on an amorphous semiconductor film 102 as well as the embodiment mode 1, and an aqueous solution 104 including Ni acetate by 10 ppm is applied selectively to a predetermined point by a spin coat method. After that, a crystalline semiconductor film is formed by crystallizing the amorphous semiconductor film 102 through a heat treatment at temperatures ranging from 500 to 550° C. for 2 to 20 hours.

Figure 3B:
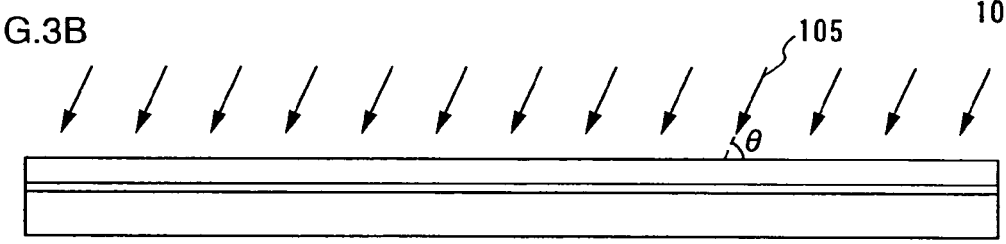

And as shown in FIG. 3B, the pulsed laser light 105 is irradiated obliquely at an angle θ (0°<θ<90°). It is noted that the conditions at the laser irradiation is the same as those in the embodiment mode 1. The pulsed excimer laser (XeCl, emission wavelength 308 nm) is irradiated under the conditions where the energy density is set to 420 mJ/cm$^2$ and the number of shots is set to 25.

Figure 3C:
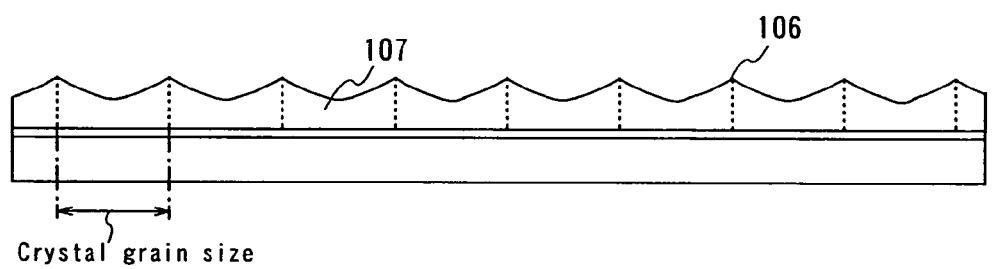

Then, the ridges 106 are formed so as to have an interval longer than the emission wavelength of the pulsed laser as shown in FIG. 3C. In other words, a crystal grain 107 is formed to be longer than the emission wavelength of the pulsed laser. Since the laser light is incident at an angle θ of 30° in the present embodiment mode, the size of the crystal grain 106 is doubled, which is approximately 616 nm. On this occasion, the size of the crystal grain in the direction perpendicular to the oblique direction is approximately 308 nm, which is as long as the wavelength of the pulsed laser. In other words, the crystal grain has a size of 308 nm×616 nm.

Thus, the size of the crystal grain 107 can be changed by controlling the incidence angle of the pulsed laser light 105. Particularly when a large crystal grain can be obtained by adding the metal element to the predetermined point of the amorphous semiconductor film 102, it is preferable to employ the method in which the incidence angle of the pulsed laser 105 is controlled to form the large crystal grain as described in the present embodiment mode.

Figure 3D:
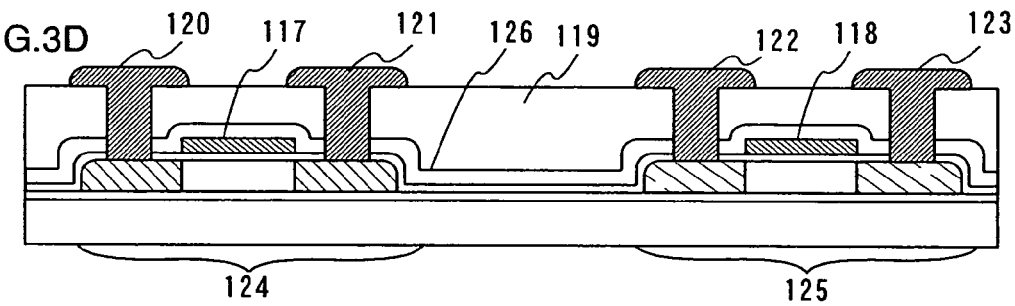

It is preferable to perform the flattening process thereafter as shown in the embodiment mode 2. And as shown in FIG. 3D, it is possible to form a thin film transistor having gate electrodes 117 and 118, a passivation film 126 covering the gate electrodes, an interlayer insulating film 119, and wirings 120 to 123 by the same steps as those shown in the embodiment mode 1.

In the present embodiment mode, the gate electrodes 117 and 118 can be also formed so that a channel-forming region is formed in one crystal grain. In particular, the crystal grain 107 can be enlarged by irradiating the pulsed laser light 105 obliquely as shown in the present embodiment mode. Moreover, this can broaden the width of the gate electrodes 117 and 118. Therefore, when the thin film transistor having the channel-forming region in one crystal grain is formed, the width of the gate electrode can be enlarged, and therefore the margin can be made wider. Thus, the thin film transistor can be manufactured accurately.

With the above steps, it is possible to provide a thin film transistor having a crystalline semiconductor film in which a crystal grain is formed in a grid pattern with the orientation aligned in the adjacent crystal grains and to provide a method for manufacturing the thin film transistor. In the thin film transistor formed to have a crystal grain with the orientation aligned in the adjacent crystal grains, at least in the thin film transistor having the channel-forming region formed in the crystal grain with the orientation aligned, the variation between the thin film transistors can be reduced. As a result, it is possible to manufacture the semiconductor device having uniform electrical characteristic and having the display unevenness reduced. Moreover, the channel-forming region may be formed in one crystal grain. As a result, the adverse effect in crystal grain boundaries can be reduced or avoided.

The present embodiment mode can be freely combined with any one of the above embodiment modes. The thin film transistor can be manufactured through the same steps as those in the embodiment mode 1 except for the step of irradiating the pulsed laser obliquely. And, the present embodiment mode can be combined with the embodiment mode 2 in point of the flattening process.

Embodiment Mode 4

The present embodiment mode explains a method for manufacturing a crystalline semiconductor film by a different method from the embodiment modes 1 and 3.

Figure 4A:
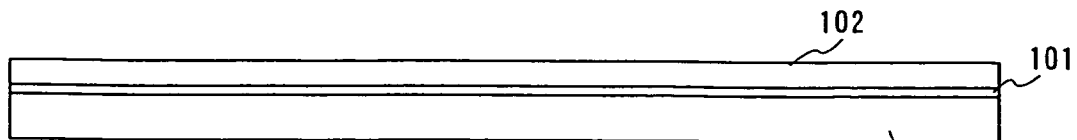
FIGS. 4A to 4F are cross-sectional view which illustrate a method for manufacturing a thin film transistor of the present invention.
Figure 4B:
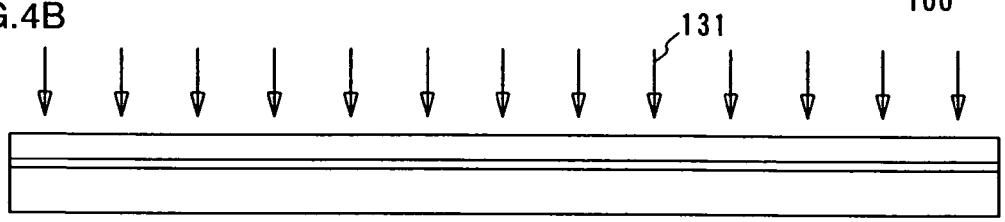

FIG. 4A shows the substrate 100 with the base film 101 and the amorphous silicon film 102 formed through the same steps as those in the embodiment mode 1. Thereafter, as shown in FIG. 4B, the amorphous semiconductor film 102 is exposed in the atmosphere in which plasma 131 is generated using one kind or plural kinds selected from the group consisting of the noble gas element, nitrogen, and ammonia as a main component (plasma treatment). These elements can be made into plasma using a plasma generator (a plasma CVD apparatus, a dry etching apparatus, or the like) and a plasma treatment is performed for 30 seconds to 20 minutes (preferably for 3 to 15 minutes). Moreover, it is preferable that the gas flow rate is in the range of 50 to 300 sccm, the substrate temperature is in the range of 200 to 500° C., and the RF is in the range of 100 to 400 W.

Figure 4C:
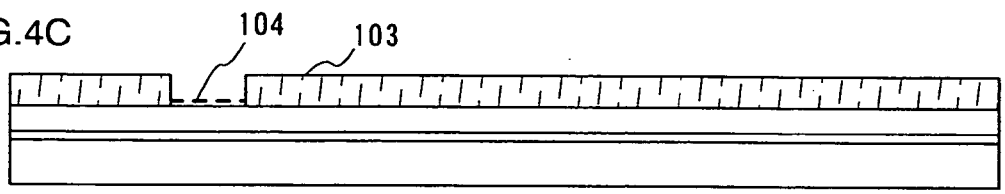

And as shown in FIG. 4C, an aqueous solution 104 including Ni acetate by 10 ppm is applied selectively to the amorphous semiconductor film 102 by the spin coat method. After that, a crystalline semiconductor film is formed by crystallizing the amorphous semiconductor film through a heat treatment at temperatures ranging from 500 to 550° C. for 2 to 20 hours.

Of course, the amorphous semiconductor film 102 may be exposed in the atmosphere in which plasma is generated using one kind or plural kinds selected from the group consisting of the noble gas element, nitrogen, and ammonia as a main component after adding the metal element selectively to the amorphous semiconductor film 102. Alternatively, after forming the mask 103, the plasma treatment may be performed, and then the metal element may be added selectively.

Figure 4D:
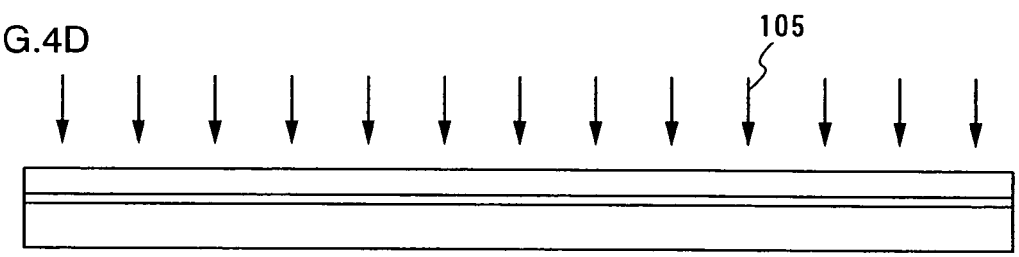

And, as shown in FIG. 4D, the pulsed laser light 105 is irradiated. In addition, the conditions at the laser irradiation are the same as those in the embodiment mode 1, and the pulsed excimer laser (XeCl, emission wavelength 308 nm) is irradiated under the conditions where the energy density is set to 420 mJ/cm$^2$ and the number of shots is set to 25.

Figure 4E:
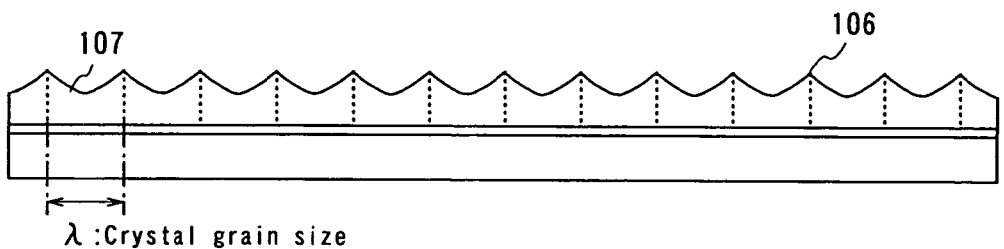

Then, the ridges 106 are formed at an interval almost equal to the emission wavelength of the pulsed laser as shown in FIG. 4E. In other words, since the excimer laser having an emission wavelength of 308 nm is irradiated in this embodiment mode, the ridges are formed regularly at intervals of approximately 308 nm, which means the crystal grain has a size of approximately 308 nm.

Figure 4F:
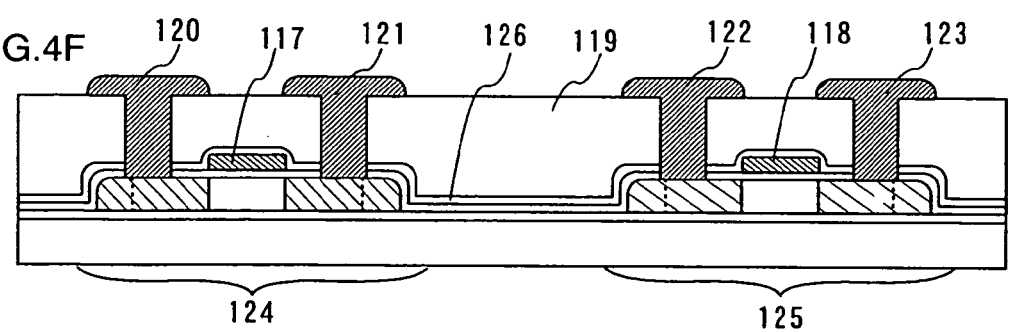

After that, it is possible to form the thin film transistor having the gate electrodes 117 and 118, the passivation film 126 covering the gate electrodes, the interlayer insulating film 119, and the wirings 120 to 123 through the same steps as those in the embodiment mode 1 as shown in FIG. 4F.

The plasma treatment can make the crystal grain small in the crystalline semiconductor film obtained without increasing the quantity of metal elements as shown in the present embodiment mode.

With the above steps, it is possible to provide a thin film transistor having a crystalline semiconductor film in which a crystal grain is formed in a grid pattern with the orientation aligned in the adjacent crystal grains and to provide a method for manufacturing the thin film transistor. Among the thin film transistors formed in the adjacent crystal grains with the orientation aligned each other, at least among the thin film transistors having the channel-forming region with the orientation aligned each other, the variation between the thin film transistors can be reduced. As a result, it is possible to manufacture the semiconductor device having uniform electrical characteristic and having the display unevenness reduced. Moreover, the channel-forming region may be formed in one crystal grain. As a result, the adverse effect in crystal grain boundaries can be reduced or avoided.

The present embodiment mode can be freely combined with any one of the above embodiment modes. The thin film transistor can be manufactured through the same steps as those in the embodiment mode 1 except for the step of the plasma treatment. Moreover, the present embodiment mode can be combined with the embodiment mode 3 having the step of irradiating the pulsed laser obliquely. And, the present embodiment mode can be combined with the embodiment mode 2 in point of the flattening process.

Embodiment Mode 5

The present embodiment mode explains a method for manufacturing an active matrix substrate having a crystalline semiconductor film. It is noted that the active matrix substrate indicates the substrate in which the thin film transistor described in the embodiment modes 1 to 4 is formed. Specifically, the active matrix substrate is the substrate having a pixel portion in which the thin film transistor is formed in matrix and having a driver circuit portion in which a plurality of thin film transistors is formed.

Figure 8A:
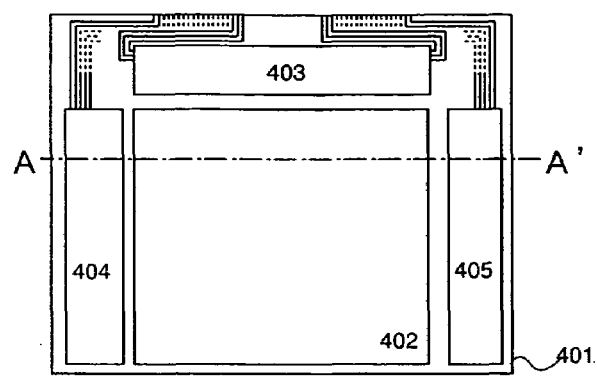
FIGS. 8A to 8C are drawings which illustrate an active matrix substrate of the present invention.

FIG. 8A is a top view of the active matrix substrate. A pixel portion 402, a signal line driver circuit 403, a first scanning line driver circuit 404, and a second scanning line driver circuit 405 are formed on a substrate 401.

The pulsed laser may be irradiated to the whole active matrix substrate to crystallize, and it is preferable to irradiate the pulsed laser separately according to the required electrical characteristic of TFT. For example, the driver circuit portion having the signal line driver circuit and the scanning line driver circuit are required TFTs having high mobility. On the other hand, in the pixel portion it is required to provide TFTs having fewer variations rather than high mobility.

Consequently, the region to be irradiated by the pulsed laser light, which is an irradiated region, and the region not to be irradiated, which is a non-irradiated region, are separated. Alternatively, the region in which the metal element is added, which is a doped region, and the region where the metal element is not added, which is a non-doped region, may be separated. Furthermore, the region where the metal element is added selectively, which is a selectively-doped region, and the region where the metal element is added all over without using the mask, which is an entirely-doped region, may be separated.

Figure 8B:
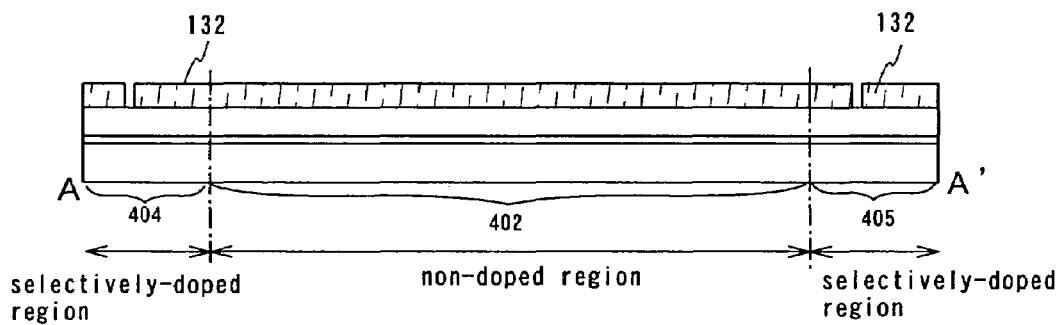
Figure 8C:
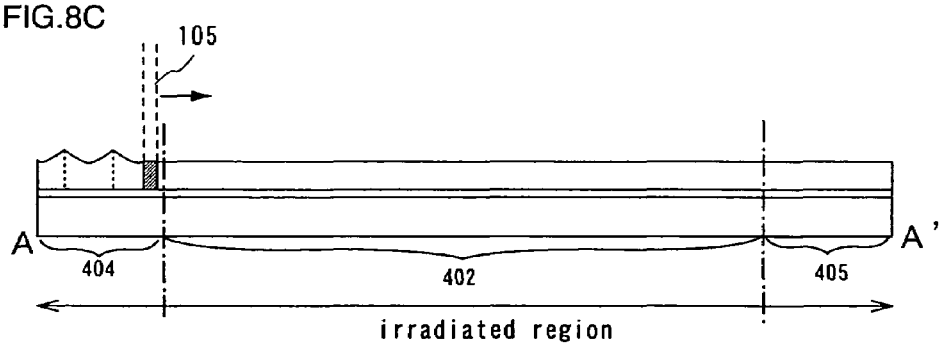

For example, in the step of adding the metal element, the first scanning line driver circuit 404 and the second scanning line driver circuit 405 are the selectively-doped regions, while the pixel portion 402 is the non-doped region using the mask 132 as shown in FIG. 8B. In addition, in the step of the laser irradiation, the first scanning line driver circuit 404, the second scanning line driver circuit 405, and the pixel portion 402 are the irradiated regions as shown in FIG. 8C.

As a result, the first scanning line driver circuit 404 and the second scanning line driver circuit 405 can be formed of TFT having the crystalline semiconductor film with a large crystal grain compared with the pixel portion 402. In addition, TFT in the first scanning line driver circuit 404 and the second scanning line driver circuit 405 has a crystal structure in which the orientation in the adjacent crystal grains is controlled to be aligned. Moreover, it is preferable to form the channel-forming region of the thin film transistor in the first scanning line driver circuit 404 and the second scanning line driver circuit 405 in one crystal grain because the adverse effect in the crystal grain boundaries can be reduced or avoided.

In addition, since the crystalline semiconductor film in which the ridges formed a grid pattern can be employed, it is possible to form the pixel portion 402 using the TFT having the variation in the electrical characteristic reduced. As a result, the display unevenness can be reduced. In addition, because the pixel portion 402 is the non-doped region, it has a crystal structure with the orientation not aligned.

Figure 9A:
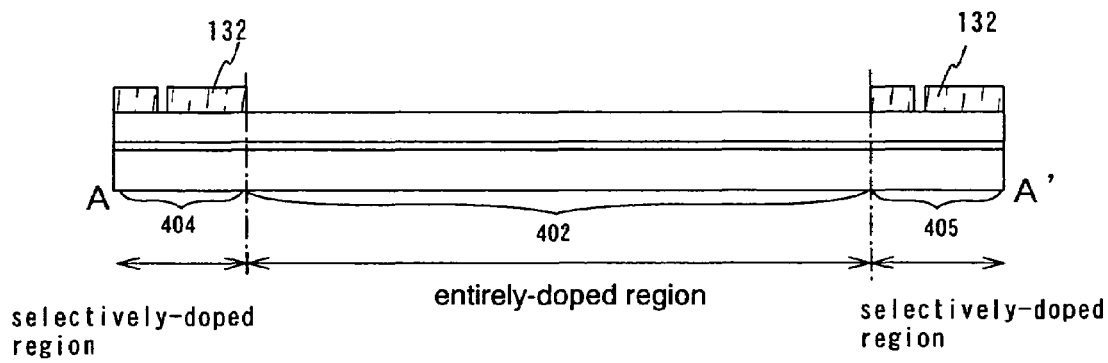
FIGS. 9A to 9C are drawings which illustrate a method for manufacturing of an active matrix substrate of the present invention.
Figure 9B:
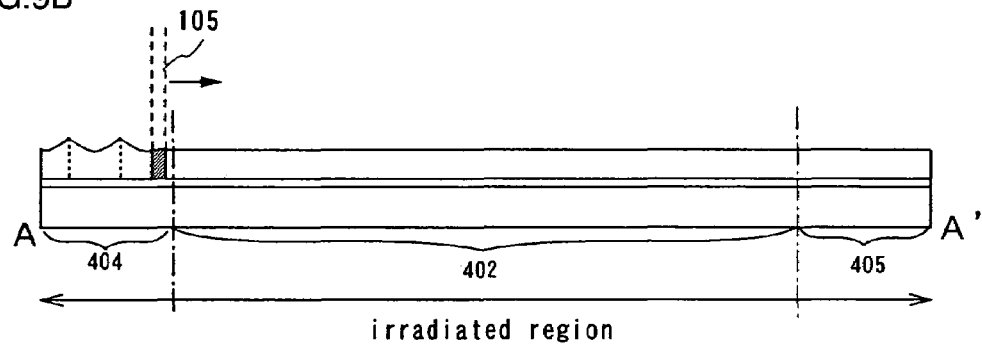

In addition, as shown in FIG. 9A, the first scanning line driver circuit 404 and the second scanning line driver circuit 405 are the selectively-doped regions, and the pixel portion 402 is the entirely-doped region. And, as shown in FIG. 9B, the first scanning line driver circuit 404, the second scanning line driver circuit 405, and the pixel portion 402 are the irradiated regions.

As a result, the first scanning line driver circuit 404 and the second scanning line driver circuit 405 can be formed of TFT having a crystalline semiconductor film with a large crystal grain compared with the pixel portion 402. In addition, TFT in the first scanning line driver circuit 404 and the second scanning line driver circuit 405 has a crystal structure in which the orientation in the adjacent crystal grains is controlled to be aligned. Moreover, it is preferable to form in one crystal grain the channel-forming region of the thin film transistor in the first scanning line driver circuit 404 and the second scanning line driver circuit 405 because the adverse effect in the crystal grain boundaries can be reduced or avoided.

In addition, since the crystalline semiconductor film in which the ridges formed a grid pattern can be employed, it is possible to form of the TFT having the variation in the electrical characteristic reduced. As a result, the display unevenness can be reduced.

Figure 9C:
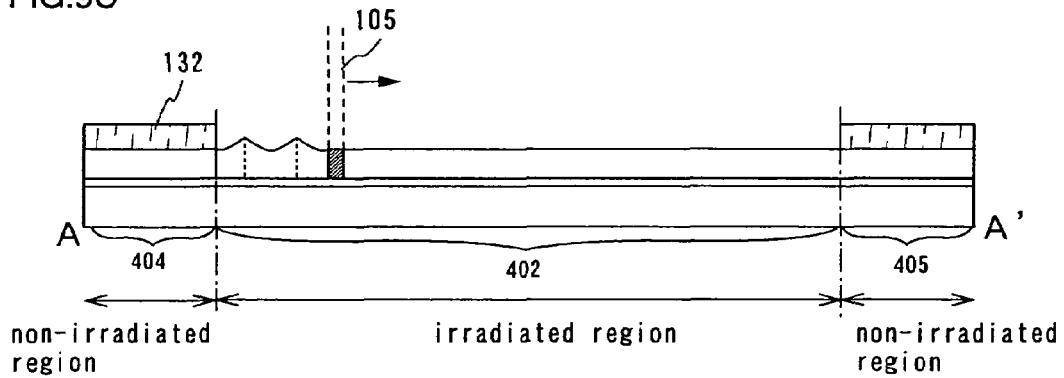

In addition, as shown in FIG. 9C, it is also possible to have the structure in which the first scanning line driver circuit 404 and the second scanning line driver circuit 405 are the non-irradiated regions, and the pixel portion 402 is the irradiated region.

As a result, the ridge is not formed in TFT of the first scanning line driver circuit 404 and the second scanning line driver circuit 405. The TFTs has a crystalline thin film which has a large grain which the first scanning line driver circuit 404 and the second scanning line driver circuit 405.

Although the present embodiment mode explains the structure in which the active matrix substrate has the pixel portion and the driver circuit portion such as the signal line driver circuit portion and the scanning line driver circuit portion formed integrally, the pixel portion and the driver circuit portion are not always necessary to be formed integrally. The signal line driver circuit portion and the scanning line driver circuit portion may be formed by an IC tip and they may be connected using a bump or the like. In particular, the signal line driver circuit formed by the IC tip can be connected to the wiring typified by a signal line or a scanning line through an anisotropic conductive film (ACF) or a flexible printed circuit (FPC), or by using a COF method or a TAB method.

The present embodiment mode can be freely combined with any one of the above embodiment modes.

Embodiment Mode 6

The present embodiment mode explains a method for manufacturing an active matrix substrate having a crystalline semiconductor film formed by differing the crystallization condition in a capacitance element and in TFT of a pixel portion.

Figure 10A:
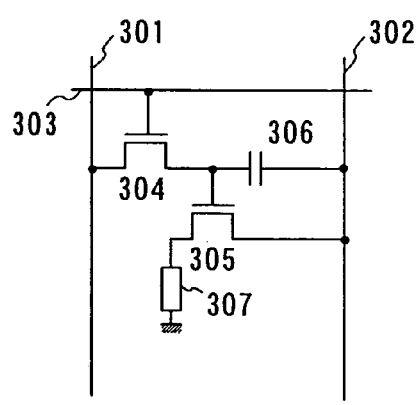
FIGS. 10A to 10D are drawings which illustrate a method for manufacturing of a pixel portion of the present invention.

For example, FIG. 10A shows a pixel circuit which has a switching TFT 304 provided in a position where a signal line 301, and a current supplying line 302 intersects a scanning line 303; a driver TFT 305; a capacitance element 306 connected between the gate and the source of the driver TFT; and a light-emitting element 307 connected to the driver TFT. In this pixel circuit, the crystallization condition of TFT, particularly the driver TFT 305, of the pixel portion is preferably made different from that in the capacitance element 306. This is because when the crystallization condition of the semiconductor film in the driver TFT 305 varies, the display by the light-emitting element or a liquid crystal element driven by the driver TFT 305 also varies. In other words, the variation of driver TFT is one of the causes of display unevenness. Therefore, it is preferable to form the driver TFT with the variation reduced by using the crystalline semiconductor film in which the ridges form a grid pattern. On the other hand, the ridge formed in the capacitance element 306 may cause leakage current. Therefore, it is preferable to form the crystalline semiconductor film without ridges formed.

Figure 10B:
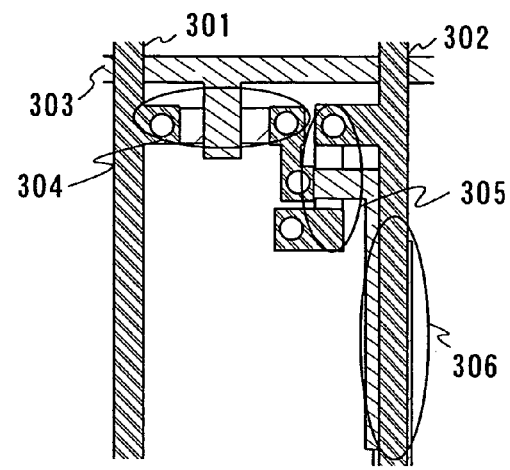

It is noted that FIG. 10B is a top view of the pixel corresponding to FIG. 10A.

Figure 10C:
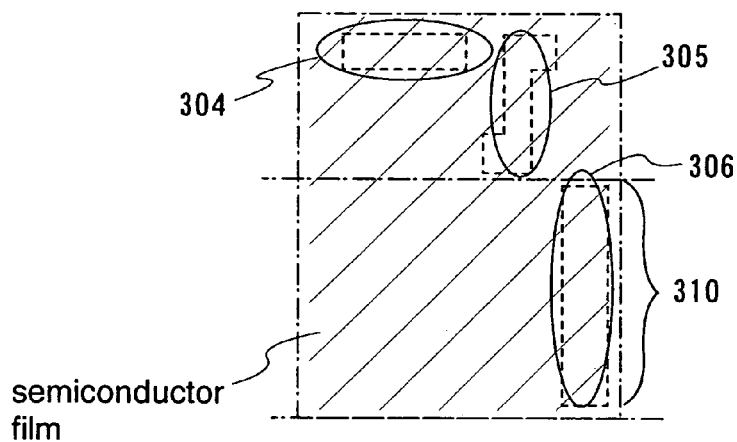

Consequently, it is preferable that the laser crystallization is performed to TFT in the pixel portion, particularly to the driver TFT, while it is not performed to the capacitance element. For example, as shown in FIG. 10C, at least the driver TFT and the capacitance element are arranged so as not to overlap each other. And, the pulsed laser is controlled so that the region where the capacitance element is formed (a capacitance element forming region) 310 is not irradiated. For example, the laser irradiation apparatus is controlled so as to irradiate the pulsed laser at the predetermined intervals.

In addition, the pulsed laser may be irradiated to the whole surface and a continuous wave laser (CW laser) may be irradiated to flatten the ridge to the capacitance element forming region in which the formation of the ridge particularly needs to be prevented. Moreover, in this case, since the region with the orientation controlled by performing the crystallization using Ni as the metal element also melts, the orientation becomes random.

Figure 10D:
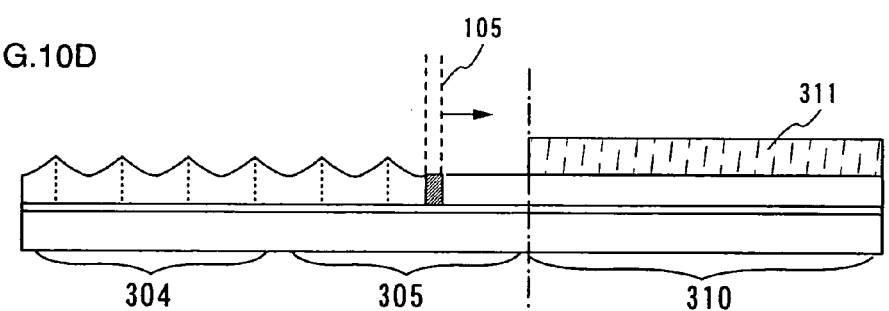

Alternatively, a mask may be provided in the capacitance element forming region so as not to be irradiated by the pulsed laser. Specifically, as shown in FIG. 10D, a laminated film 311 is formed by laminating a film having a high refraction index and a film having a low refraction index as a mask at least on the capacitance element 306 in the capacitance element forming region 310. On this occasion, each film is preferably laminated so that it has a thickness of $(\lambda/4) \cdot n$ where $\lambda$ is the wavelength of the irradiated laser and n is each refraction index. Specifically, when a pulsed excimer laser 105 (emission wavelength 308 nm) is irradiated to the whole surface of the pixel portion, a SiON film having a thickness of 42 nm and an ITO film having a thickness of 36 nm are laminated in order. Here, the laminated film is formed so as to have the film thickness from several hundred nm to several µm.

Since the excimer laser 105 is refracted in the laminated film 311, the laser is not irradiated to the capacitance element 306, or the laser is irradiated with the energy attenuated. Therefore, in the capacitance element 306 on which the laminated film 311 is formed, the ridge is not formed or the ridge is formed low. As a result, leakage current can be reduced. It is noted that the laminated film may be formed in the region where the ridge is not preferred to be formed except for the capacitance element.

As above, in the pixel portion, it is possible to decrease the variation in TFT by irradiating the pulsed laser to the predetermined position, and to reduce the leakage current from the capacitance element by not irradiating the pulsed laser to the other position.

In addition, in FIGS. 10C and 10D, it is possible to obtain the crystal structure with the orientation not controlled in the region where the capacitance element is formed when the metal element is not added to the semiconductor film therein. Specifically, the metal element may be added with the mask formed on the semiconductor film where at least the capacitance element is formed. For example, when Ni is used as the metal element, nickel silicide segregates in the ridge. When nickel silicide cannot be removed enough in the gettering by any chance, the conductive film of the capacitance element and the semiconductor film of the capacitance element are likely to short out, which is not preferred. Therefore, it is desirable to control the doped region so that the metal element is not added on the semiconductor film where the capacitance element is formed.

On this occasion, it is also possible to obtain the crystal structure with the orientation aligned by adding the metal element to the semiconductor film in which the driver circuit is formed. Patterning is performed so that the direction in which the current flows conforms to the direction in which the grain boundary of the crystal structure having the orientation formed by adding Ni to the driver TFF runs through. As a result, the electrical characteristic of the driver TFT can be enhanced and the variation between the driver TFTs due to the crystal grain boundary can be reduced.

The present embodiment mode can be freely combined with any one of the above embodiment modes.

Embodiment Mode 7

This embodiment mode explains a light-emitting device as an example of the semiconductor device having the crystalline semiconductor film.

Figure 12A:
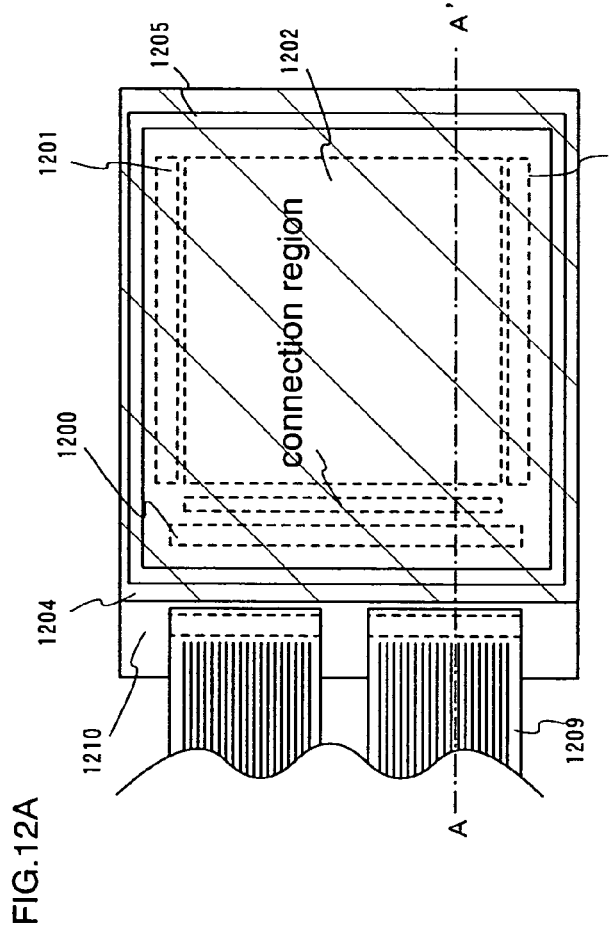
FIGS. 12A and 12B are drawings which illustrate a light emitting device of the present invention.

FIG. 12A shows the light-emitting device where a signal line driver circuit 1200, a scanning line driver circuit 1201, and a pixel portion 1202 are formed on a first substrate 1210.

Figure 12B:
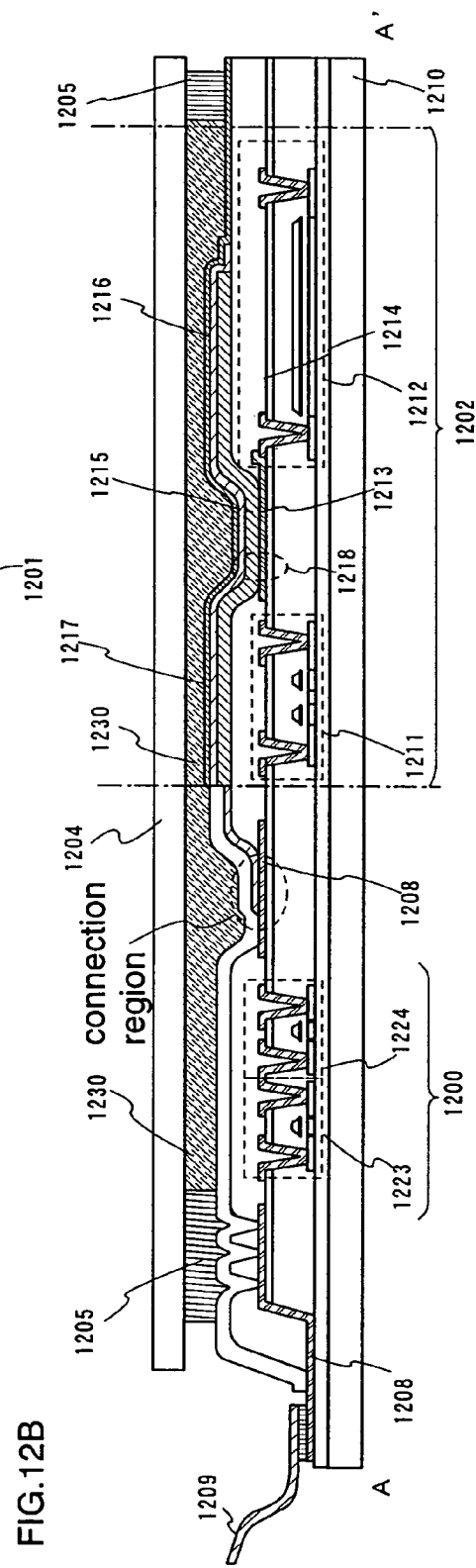

FIG. 12B shows a cross-sectional view of a display device taken along A-A' which illustrates a signal line driver circuit 1201 equipped with a CMOS circuit having an n-channel TFT 1223 and a p-channel TFT 1224 on the first substrate 1210. The n-channel TFT 1223 and the p-channel TFT 1224 are formed using the crystalline semiconductor film having the crystal grains formed in a grid pattern by performing the laser annealing with the use of the pulsed laser. It is particularly preferable to form the channel-forming region in one crystal grain. The TFT forming the signal line driver circuit 1200 and the scanning line driver circuit 1201 may be formed of the CMOS circuit, a PMOS circuit, or an NMOS circuit.

The pixel portion 1202 has a switching TFT 1221 and a driver TFT 1212. The switching TFT 1221 and the driver TFT 1212 are formed using the crystalline semiconductor film having the crystal grains formed in a grid pattern by performing the laser annealing with the use of the pulsed laser. It is preferable to form the channel-forming region in one crystal grain. It is not necessary for the TFT of the pixel portion 1201 to have high crystallinity compared with the signal line driver circuit 1200 and the scanning line driver circuit 1201. The pixel portion 1202 has an insulator 1214 which covers the first electrode 1213 of the light-emitting element connected to one electrode of the driver TFT 1212; the switching TFT 1211; and the driver TFT 1212, and which has an opening in the position corresponding to the first electrode 1213 of the light-emitting element. The pixel portion 1202 also has a light-emitting element 1218 in which the electroluminescent layer 1215 is provided on the first electrode 1213 and the second electrode 1216 of the light-emitting layer is further provided on the electroluminescent layer 1215. It is noted that the electroluminescent layer is formed of an organic material or an inorganic material, and it is constituted by combining an electron injecting layer, an electron transporting layer, a light emitting layer, a hole transporting layer, a hole injecting layer, and the like appropriately.

The insulator 1214 may be formed of an organic resin film such as resist, polyimide, or acryl, or may be formed of an inorganic insulating film including silicon such as silicon nitride or silicon oxide. Here, the insulator 1214 is formed of a positive photosensitive acryl resin film. It is noted that when the organic resin film or the like is used, in order to prevent the moisture or the oxygen from penetrating thereinto, it is preferable to form an insulating film including silicon nitride or silicon nitride oxide as its main component or to form a DLC (Diamond Like Carbon) film including hydrogen.

It is noted that in order to improve the coverage to the step of the electrode or the electroluminescent layer to be formed afterward, it is preferable to form the insulator 1214 having curvature in its upper part or in its lower part. For example, when the insulator 1214 is formed of the positive photosensitive acrylic, it is preferable that only the upper part of the insulator 1214 has radius of curvature (in the range of 0.2 to 3 µm). In addition, either a negative type which becomes insoluble in etchant by the irradiation of the light or a positive type which becomes soluble in etchant by the irradiation of the light can be applied as the insulator 1214.

Since the first electrode 1213 of the light-emitting element contacts the first electrode of the driver TFT 1212, it is desirable that at least the bottom surface of the first electrode 1213 of the light-emitting element is formed of the material having an ohmic contact with the first electrode region of the semiconductor film and that the surface thereof contacting the electroluminescent layer is formed of the material which has high work function. For example, the first electrode 1213 of the light-emitting element may be formed of a single layer of a titanium nitride film or may be formed by laminating two or more layers.

Furthermore, when the first electrode 1213 and the second electrode 1216 of the light-emitting element are formed of a conductive film having translucency, it is possible to manufacture a light-emitting device of both sided emission type.

The first electrode 1213 can be formed of a non-light-transmitting conductive film, preferably the conductive film having high reflectivity, and the second electrode 1216 can be formed of a light-transmitting conductive film. This can manufacture a light-emitting device of a top-emission type in which the light is emitted only to the sealing substrate side.

On the contrary, when the first electrode 1213 is formed of the light-transmitting conductive film and the second electrode 1216 is formed of the non-light-transmitting conductive film, preferably the conductive film having high reflectivity, it is possible to manufacture a light-emitting device of a bottom-emission type in which the light is emitted only to the substrate side.

The light can be used efficiently by employing the conductive film having high reflectivity as the electrode of the light-emitting element provided in the side to which the light is not emitted.

Both the first electrode and the second electrode can be the anode or the cathode according to the pixel structure. For example, when the first electrode is the anode and the second electrode is the cathode, the specific material for the electrode is explained as follows.

It is preferable to use metal, alloy, conductive compound, a mixture of these, or the like having high work function (work function is 4.0 eV or more) as the anode material. More specifically, ITO (indium tin oxide), IZO (indium zinc oxide) including indium oxide which is mixed with tin oxide (ZnO) in the range of 2 to 20%, gold (Au), platinum (Pt), nickel (Ni), tungsten (W), chromium (Cr), molybdenum (Mo), iron (Fe), cobalt (Co), copper (Cu), palladium (Pd), or the metallic nitride material such as TiN can be used as the anode material.

On the other hand, it is desirable to use metal, alloy, conductive compound, a mixture of these, or the like having low work function (work function is 3.8 eV or less) as the cathode material. Specifically, the cathode can be formed of the material such as the element belonging to the first group or the second group in the periodic table, that is to say, alkali metal such as Li or Cs; alkaline-earth metal such as Ca or Sr; Mg; alloy including these such as Mg:Ag or Al:Li; a chemical compound such as LiF, CsF, or $CaF_2$; or transition metal including rare-earth metal. However, since the cathode needs to have translucency, the cathode is formed by forming these metals or the alloy including these metals extremely thinly and by laminating the metal (including alloy) such as ITO thereon. These anode and cathode can be formed by the vapor deposition method, the sputtering method, or the like.

In addition, when the full-color display is performed, the electroluminescent layer 1215 is formed in such a way that the materials each showing the red (R), the green (G), and the blue (B) color emission are formed selectively by the vapor deposition method with the use of the respective deposition masks or by an ink-jetting method. Specifically, CuPc or PEDOT is employed as HIL, α-NPD is employed as HTL, BCP or $Alq_3$ is employed as ETL, BCP:Li or $CaF_2$ is employed as EIL respectively. In addition, $Alq_3$ doped with dopant in accordance with the respective colors of R, G, and B ($DCM_2$ or the like in the case of R, DMQD or the like in the case of G) may be employed as EML.

More specific laminated structure of the electroluminescent layer 1215 is explained as follows. In the case of forming the electroluminescent layer showing red color emission, for example, CuPc is formed 30 nm in thickness and then α-NPD is formed 60 nm in thickness. After that, the same mask is used to form $Alq_3$ with $DCM_2$ and rubrene added 40 nm in thickness as a red light-emitting layer, to form BCP 40 nm in thickness as an electron transporting layer, and to form BCP with Li added 1 nm in thickness as an electron injecting layer. In addition, in the case of forming the electroluminescent layer showing green color emission, for example, CuPc is formed 30 nm in thickness and then α-NPD is formed 60 nm in thickness. After that, the same vapor deposition mask is used to form $Alq_3$ with coumarin 545T added 40 nm in thickness as the green light-emitting layer, to form BCP 40 nm in thickness as the electron transporting layer, and to form BCP with Li added 1 nm in thickness as the electron injecting layer. In addition, in the case of forming the electroluminescent layer showing blue color emission, for example, CuPc is formed 30 nm in thickness and then α-NPD is formed 60 nm in thickness. After that, the same mask is used to form bis [2-(2-hydroxyphenyl) benzoxazolate] zinc: $Zn(PBO)_2$ in 10 nm thick as a light-emitting layer. Then, BCP is formed in 40 nm thick as the electron transporting layer and BCP with Li added is formed in 1 nm thick as the electron injecting layer. It is noted that the structure is not limited to the laminated structure of the organic compound layer described above.

Among the electroluminescent layers of these colors, CuPc layer and α-NPD layer, which are common to all the colors, can be formed all over the pixel portion. In addition, the mask can be shared among these colors. For example, after forming the red electroluminescent layer, the mask is moved to form the green electroluminescent layer. Then the mask is moved again to form the blue electroluminescent layer. In addition, the order of the electroluminescent layer of each color to be formed may be set appropriately.

In addition, in the case of white light emission, a full color display may be performed by providing a color filter or a color conversion layer separately. The color filter or the color conversion layer may be pasted after providing it to the second substrate.

In order to prevent the light-emitting element from deteriorating due to moisture, oxygen, or the like, there is a protective film 1217 provided so as to cover the second electrode of the light-emitting element. In this embodiment mode, the protective film 1217 is formed of the insulating film including silicon nitride or silicon nitride oxide as its main component obtained by DC sputtering or RF sputtering, or formed of a DLC (Diamond Like Carbon) film including hydrogen.

And as shown in FIGS. 12A and 12B, the second electrode 1216 of the light-emitting element is connected to a connection wiring 1208 through a lead wiring from an opening (contact) provided at the connection region in the insulator 1214. The connection wiring 1208 is electrically connected to a flexible print circuit (FPC) 1209 by anisotropic conductive resin (ACF). And a video signal or a clock signal to be an external input signal is received through the FPC 1209. Although only the FPC is illustrated here, a print wiring board (PWB) may be provided in this FPC.

The present embodiment mode shows the light-emitting device with the driver integrally formed in which the signal line driver circuit 1200 and the scanning line driver circuit 1201 are formed on the first substrate 1210. However, the signal line driver circuit and the scanning line driver circuit may be formed by IC and they may be electrically connected to a signal line or a scanning line by a SOG method or a TAB method.

When ACF is pasted by pressurizing or heating, attention should be paid so that crack is not generated due to the flexibility of the substrate or the softening by the heating. For example, the substrate having high hardness may be set as a support in the region to be pasted.

In the periphery of the first substrate, there is provided a sealant 1205 with which the first substrate and the second substrate 1204 are pasted, and then they are sealed. It is preferable to use epoxy resin as the sealant 1205.

When they are sealed using the second substrate 1204, there is formed a space between the second substrate and the protective film 1217. It is preferable to fill this space with the inert gas such as nitrogen gas or to form the material having high moisture-absorption characteristic in order prevent the light-emitting device from deteriorating due to moisture or oxygen. In the present embodiment mode, a resin 1230 having high moisture-absorption characteristic and high light-transmitting characteristic is formed. Since the resin 1230 is light-transmitting, transmittance does not decrease even when the light from the light-emitting element is emitted to the second substrate side.

As above, it is possible to manufacture the light-emitting device including the thin film transistor having the crystalline semiconductor film with the crystal grains formed in a grid pattern, particularly the thin film transistor having the channel-forming region formed in one crystal grain. By forming the thin film transistor having the channel-forming region in one crystal grain, the adverse effect in the crystal grain boundary can be reduced or avoided. As a result, the electrical characteristic is uniformed, and the thin film transistor having higher mobility can be manufactured, which can provide a light-emitting device of high quality.

Embodiment Mode 8

The present embodiment mode explains a liquid crystal display device, which is an example of the semiconductor device having the crystalline semiconductor film.

Figure 13A:
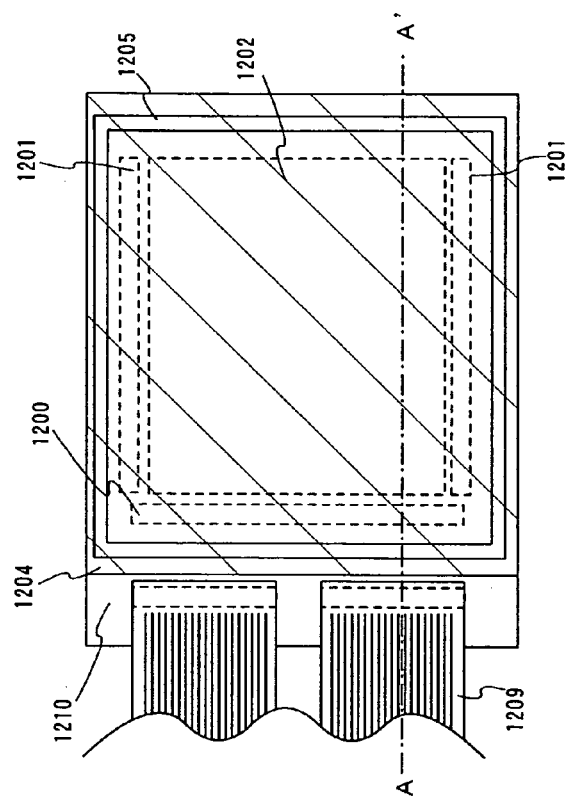
FIGS. 13A and 13B are drawings which illustrate a liquid crystal display device of the present invention.

FIG. 13A illustrates the liquid crystal display device in which a signal line driver circuit 1200, a scanning line driver circuit 1201, and a pixel portion 1202 are formed on a first substrate 1210.

Figure 13B:
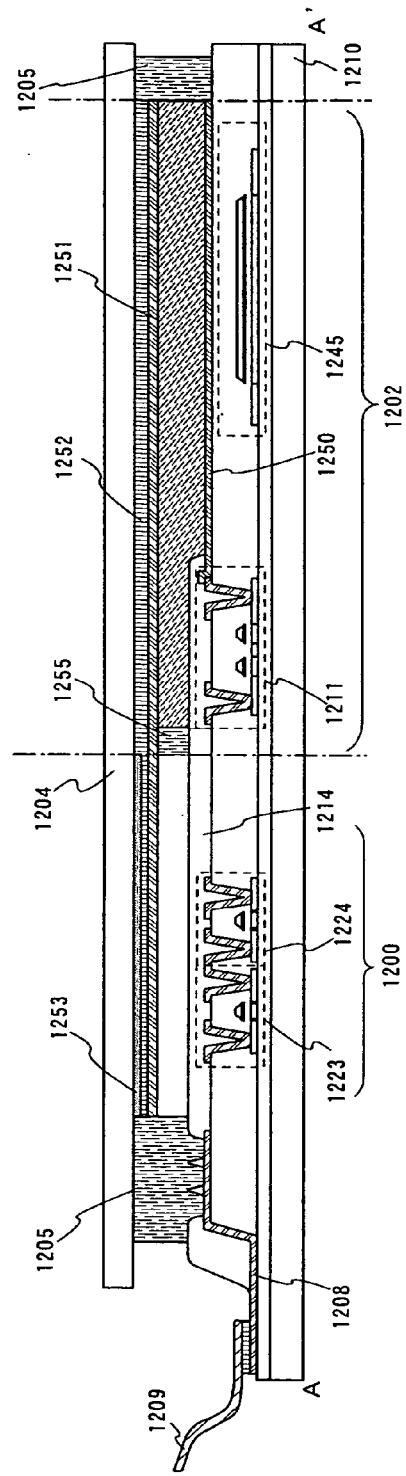

FIG. 13B is a cross-sectional view of a display device taken along A-A', which illustrates the signal line driver circuit 1201 equipped with a CMOS circuit having an n-channel TFT 1223 and a p-channel TFT 1224 on the first substrate 1210. The n-channel TFT 1223 and the p-channel TFT 1224 are formed using the crystalline semiconductor film in which the crystal grains are formed in a grid pattern by performing the laser annealing with the use of the pulsed laser. It is particularly preferable to form the channel-forming region in one crystal grain. TFT forming the signal line driver circuit 1200 and the scanning line driver circuit 1201 may be formed of the CMOS circuit, a PMOS circuit, or an NMOS circuit.

The pixel portion 1202 has a switching TFT 1221 and a capacitance element 1245. The switching TFT 1221 is formed using the crystalline semiconductor film with the crystal grains formed in a grid pattern obtained by performing the laser annealing with the use of the pulsed laser. It is particularly preferable to form the channel-forming region in one crystal grain. The capacitance element 1245 is constituted by the gate insulating film sandwiched between the semiconductor film with the impurity added and the gate electrode. It is noted that TFT of the pixel portion 1202 does not need to have high crystallinity compared to the signal line driver circuit 1200 and the scanning line driver circuit 1201. An insulator 1214 having a pixel electrode 1250 connected to one electrode of the switching TFT 1211 is provided so as to cover the n-channel TFT 1223, the p-channel TFT 1224, the pixel electrode 1250, and the switching TFT 1211.

In the second substrate 1204 to become an opposing substrate, a black matrix 1253 is provided in the position corresponding to the signal line driver circuit 1200, and a color filter 1252 is provided at least in the position corresponding to the pixel portion. The rubbing treatment is performed to the second substrate 1204 with the opposing electrode 1251 formed, and the first substrate 1210 and the second substrate 1204 are pasted with a spacer 1255 interposed therebetween.

A liquid crystal layer is injected between the first substrate 1210 and the second substrate 1204. It is preferable to inject the liquid crystal layer in the vacuum atmosphere. Alternatively, the liquid crystal layer may be discharged by drops into the first substrate 1210 and then the first substrate 1210 may be pasted with the second substrate 1204. In particular, in the case of using the large substrate, discharging the liquid crystal layer by drops is more preferable than injecting it.

The first substrate 1210 and the second substrate 1204 are pasted with the use of the sealant 1205. It is preferable to provide a polarizer in the first substrate 1210 and the second substrate 1204 appropriately so as to enhance the contrast.

As above, it is possible to manufacture the liquid crystal display device including the thin film transistor having the crystal grains formed in a grid pattern, particularly the thin film transistor having the channel-forming region formed in one crystal grain. By forming the thin film transistor having the channel-forming region formed in one crystal grain, the adverse effect in the crystal grain boundary can be reduced or avoided. As a result, it is possible to manufacture a thin film transistor having higher mobility and to provide a liquid crystal display device of high quality.

Embodiment Mode 9

As the examples of the electronic instruments manufactured by applying the present invention, there are a digital camera, a sound playback device such as a car audio, a note-type personal computer, a game machine, a personal digital assistant (a mobile phone, a mobile game machine, or the like), an image reproduction device equipped with a recording medium such as a home-use game machine, and the like. FIGS. 14A to 14H illustrate the specific examples of these electronic instruments.

Figure 14A:
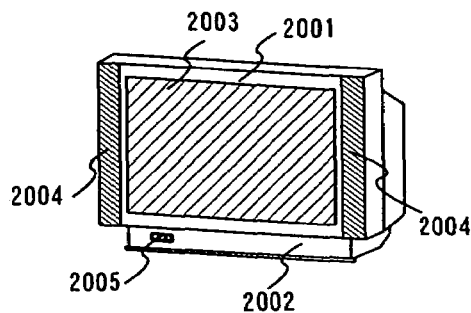
FIGS. 14A to 14H are drawings which illustrate electronic instruments of the present invention.

FIG. 14A shows a display device including a chassis 2001, a supporting stand 2002, a display portion 2003, a speaker portion 2004, a video input terminal 2005, and the like. The display portion 2003 has a light-emitting element or a liquid crystal element and has a TFT formed using a crystalline semiconductor film having the crystal grains formed in a grid form, particularly having the orientation aligned in the adjacent crystal grains, obtained by performing the laser annealing using the pulsed laser. Moreover, the channel-forming region may be formed in one crystal grain. It is noted that the display portion 2003 has the pixel portion and the driver circuit portion.

Figure 14B:
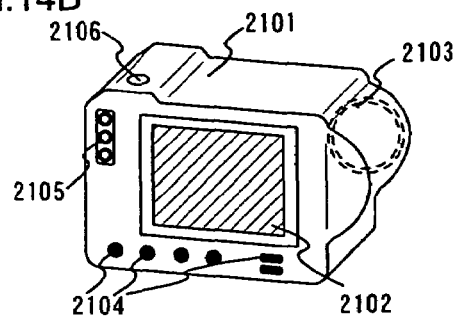

FIG. 14B shows a digital still camera including a main body 2101, a display portion 2102, an image receiving portion 2103, an operation key 2104, an external connection port 2105, a shutter 2106, and the like. The display portion 2102 has a light-emitting element or a liquid crystal element and has a TFT formed using a crystalline semiconductor film having the crystal grains formed in a grid form, particularly having the orientation aligned in the adjacent crystal grains, obtained by performing the laser annealing using the pulsed laser. Moreover, the channel-forming region may be formed in one crystal grain. It is noted that the display portion 2102 has the pixel portion and the driver circuit portion.

Figure 14C:
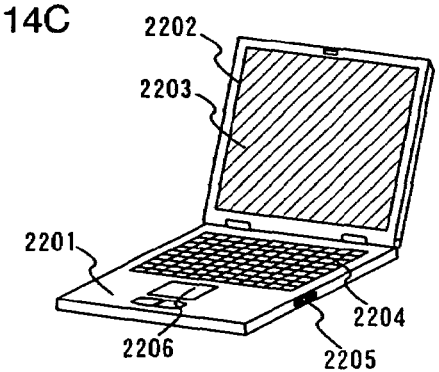

FIG. 14C shows a note-type personal computer including a main body 2201, a chassis 2202, a display portion 2203, a keyboard 2204, an external connection port 2205, a pointing mouse 2206, and the like. The display portion 2203 has a light-emitting element or a liquid crystal element and has a TFT formed using a crystalline semiconductor film having the crystal grains formed in a grid form, particularly having the orientation aligned in the adjacent crystal grains, obtained by performing the laser annealing using the pulsed laser. Moreover, the channel-forming region may be formed in one crystal grain. It is noted that the display portion 2203 has the pixel portion and the driver circuit portion.

Figure 14D:
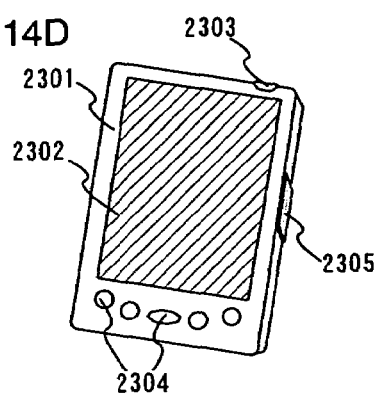

FIG. 14D shows a mobile computer including a main body 2301, a display portion 2302, a switch 2303, an operation key 2304, an infrared port 2305, and the like. The display portion 2302 has a light-emitting element or a liquid crystal element and has a TFT formed using a crystalline semiconductor film having the crystal grains formed in a grid form, particularly having the orientation aligned in the adjacent crystal grains, obtained by performing the laser annealing using the pulsed laser. Moreover, the channel-forming region may be formed in one crystal grain. It is noted that the display portion 2302 has the pixel portion and the driver circuit portion.

Figure 14E:
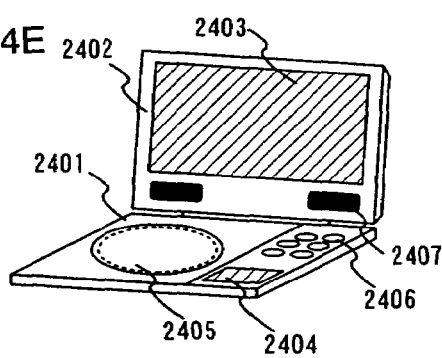

FIG. 14E shows a mobile image reproduction device with a recording medium equipped including a main body 2401, a chassis 2402, a display portion A2403, a display portion B2404, a recording medium reader 2405, an operation key 2406, a speaker portion 2407, and the like. The display portion A2403 mainly displays the image information, while the display portion B2404 mainly displays textual information. The display portion A2403 and B2404 have a light-emitting element or a liquid crystal element and have a TFT formed using a crystalline semiconductor film having the crystal grains formed in a grid form, particularly having the orientation aligned in the adjacent crystal grains, obtained by performing the laser annealing using the pulsed laser. Moreover, the channel-forming region may be formed in one crystal grain. It is noted that the display portion A2403 and B2404 have the pixel portion and the driver circuit portion.

Figure 14F:
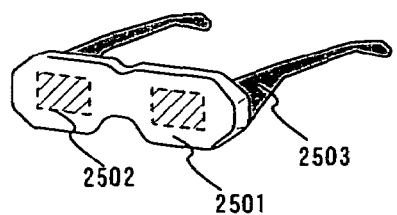

FIG. 14F shows a goggle type display including a main body 2501, a display portion 2502, and an arm portion 2503. The display portion 2502 has a light-emitting element or a liquid crystal element and has a TFF formed using a crystalline semiconductor film having the crystal grains formed in a grid form, particularly having the orientation aligned in the adjacent crystal grains, obtained by performing the laser annealing using the pulsed laser. Moreover, the channel-forming region may be formed in one crystal grain. It is noted that the display portion 2502 has the pixel portion and the driver circuit portion.

Figure 14G:
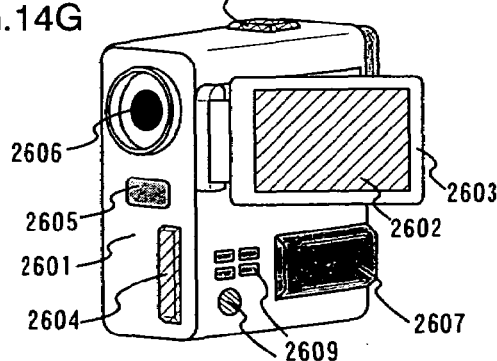

FIG. 14G shows a video camera including a main body 2601, a display portion 2602, a chassis 2603, an external connection port 2604, a remote control receiver 2605, an image receiver 2606, a battery 2607, an audio input portion 2608, an operation key 2609, and the like. The display portion 2602 has a light-emitting element or a liquid crystal element and has a TFT formed using a crystalline semiconductor film having the crystal grains formed in a grid form, particularly having the orientation aligned in the adjacent crystal grains, obtained by performing the laser annealing using the pulsed laser. Moreover, the channel-forming region may be formed in one crystal grain. It is noted that the display portion 2602 has the pixel portion and the driver circuit portion.

Figure 14H:
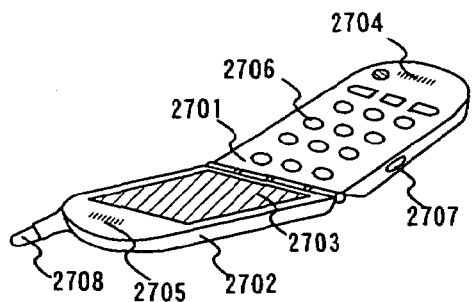

FIG. 14H shows a mobile phone, one of personal digital assistants, including a main body 2701, a chassis 2702, a display portion 2703, an audio input portion 2704, an audio output portion 2705, an operation key 2706, an external connection port 2707, an antenna 2708, and the like. The display portion 2703 has a light-emitting element or a liquid crystal element and has a TFT formed using a crystalline semiconductor film having the crystal grains formed in a grid form, particularly having the orientation aligned in the adjacent crystal grains, obtained by performing the laser annealing using the pulsed laser. Moreover, the channel-forming region may be formed in one crystal grain. It is noted that the display portion 2703 has the pixel portion and the driver circuit portion.

The above electronic instruments can have the thin film transistor having the crystalline semiconductor film with the crystal grains arranged in a grid pattern in which the orientation is aligned in the adjacent crystal grains. The variation between the thin film transistors having the orientation aligned in the adjacent crystal grains, at least between the thin film transistors having the orientation aligned can be reduced. As a result, the electronic instruments with the electrical characteristic uniformed and the display unevenness reduced can be manufactured. Furthermore, the electronic instruments having the adverse effect in the crystal grain boundary reduced or removed can be manufactured.

The present embodiment mode can be freely combined with any one of the above embodiment modes.

EMBODIMENT

Embodiment 1

This embodiment explains the principle that the ridge is formed so as to stand in order with reference to FIGS. 11A to 11E.

Figure 11A:
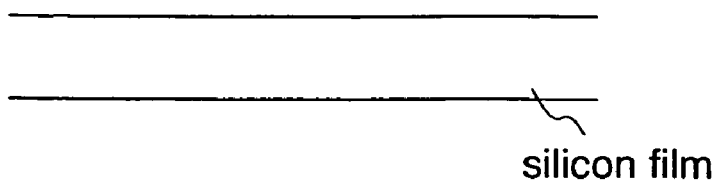
FIGS. 11A to 11E are drawings which illustrate the principle of manufacturing the crystalline semiconductor film of the present invention.

FIG. 11A shows a silicon film before being irradiated by pulsed laser light.

Figure 11B:
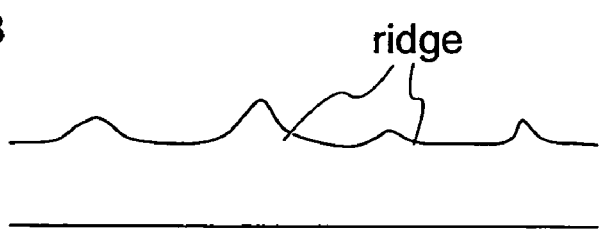

As shown in FIG. 11B, the ridge is formed when the pulsed laser light is irradiated for the first shot. For example, in the case of forming the silicon film to which the metal element for promoting the crystallization is added and the heat treatment is performed, the ridge is formed in the position where the crystal grains grown from the nucleus formed in the heat treatment collide lastly. When the heat treatment using the metal element is not performed, the ridge is formed in the random position.

Figure 11C:
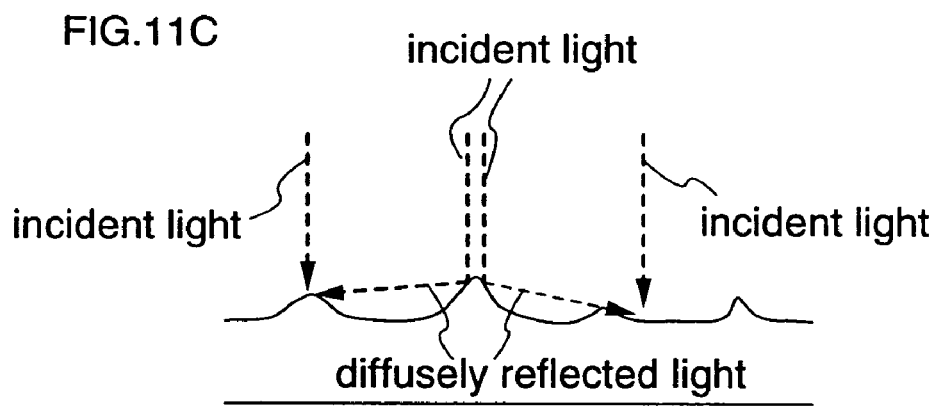

As shown in FIG. 11C, when the pulsed laser light is irradiated for the second shot, scattered light and reflected light (both of them are collectively referred to as diffusely reflected light) increase in the laser irradiation because of the concavity and convexity due to the ridge on the surface of the silicon film, which results in the interference between the incident light and the diffusely reflected light.

Figure 11D:
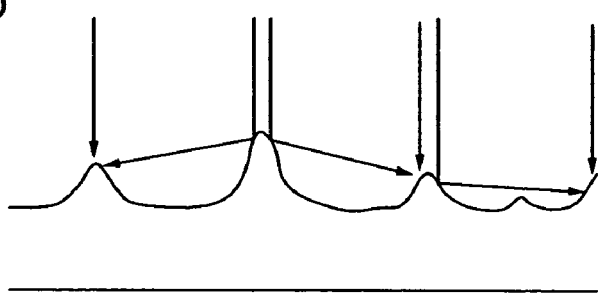
Figure 11E:
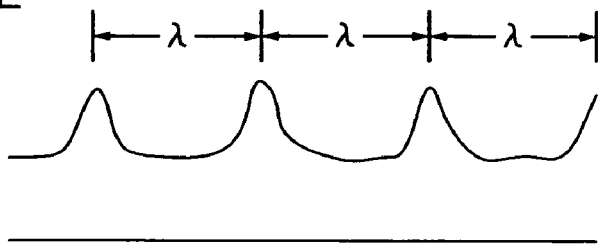

And, as shown in FIG. 11D, when the pulsed laser light is irradiated for the third shot or more, the region where the laser light is reinforced due to the interference is crystallized lastly because the temperature is high. Therefore, the ridge is newly formed in the place where the laser light is reinforced. When the laser light is irradiated further, the ridge produces new diffusely reflected light, which causes the interference in another place.

It is considered that such an interference occurs in all the ridges and the number of ridges increases. And the higher ridge produces the more intense diffusely reflected light. Therefore, when there are two ridges within the wavelength of the pulsed laser light (for example an excimer laser, specifically a XeCl excimer laser, has a wavelength of approximately 300 nm), the higher ridge grows as the number of shots increases, while the lower ridge disappears at the time of melting.

For this reason, even though the ridges stand at random initially, the high ridges come to form a grid pattern as the number of shots of pulsed laser light increases. In addition, when the ridges come to form a grid pattern to some extent, a temperature distribution becomes more remarkable, which promotes the regular formation of the ridges.

It is considered that the ridge forms a grid pattern as thus described. In other words, the crystal grain is formed in a grid pattern.

What is claimed is:

1. A method for manufacturing a semiconductor device comprising the steps of:
   adding a metal containing material for promoting crystallization selectively to an amorphous semiconductor film,
   forming a crystalline semiconductor film by heating the amorphous semiconductor film,
   forming crystal grains in a grid pattern at an interval almost equal to an emission wavelength of pulsed laser light by irradiating the pulsed laser light to the crystalline semiconductor film wherein adjacent crystal grains have a same orientation, and
   patterning the crystalline semiconductor film so that a channel-forming region of a thin film transistor includes at least one of the crystal grains.

2. A method for manufacturing a semiconductor device according to claim 1,
   wherein the crystalline semiconductor film is patterned so that a channel-forming region of the thin film transistor includes the crystal grains with the orientation aligned and does not have a crystal grain boundary of the crystal grain therein.

3. A method for manufacturing a semiconductor device according to claim 1,
   wherein the pulsed laser light is irradiated obliquely to the amorphous semiconductor film.

4. A method for manufacturing a semiconductor device according to claim 1 further comprising the steps of:
   forming a conductive film over the patterned crystalline semiconductor film,
   applying an organic material on the conductive film,
   forming a mask by exposing the organic material, and
   forming a gate electrode by etching the conductive film using the mask,
   wherein the gate electrode is formed between a adjacent ridges.

5. A method for manufacturing a semiconductor device according to claim 1,
   wherein the pulsed laser light is emitted from one or plural lasers selected from the group consisting of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser.

6. A method for manufacturing a semiconductor device according to claim 1,
   wherein a solution including the metal element for promoting the crystallization is added to the amorphous semiconductor film by a spin coat method, a dip method, an ion implantation method, or a sputtering method.

7. A method for manufacturing a semiconductor device according to claim 1,
   wherein the metal containing material for promoting the crystallization comprises a metal selected from the group consisting of Ni, Fe, Co, Pd, Pt, Cu, Au, Ag, In, and Sn.

8. A method for manufacturing a semiconductor device comprising the steps of:
   adding a metal containing material for promoting crystallization selectively to an amorphous semiconductor film,
   forming a crystalline semiconductor film by heating the amorphous semiconductor film,
   forming a crystal grain in a grid pattern at an interval almost equal to an emission wavelength of pulsed laser light by irradiating the pulsed laser light to the crystalline semiconductor film wherein adjacent crystal grains have a same orientation, and
   patterning the crystalline semiconductor film so that a channel-forming region of a thin film transistor includes a crystal grain with the orientation aligned and that a capacitance element comprising a semiconductor film with no metal element added is formed.

9. A method for manufacturing a semiconductor device according to claim 8,
   wherein the crystalline semiconductor film is patterned so that a channel-forming region of the thin film transistor includes the crystal grains with the orientation aligned and does not have a crystal grain boundary of the crystal grain therein.

10. A method for manufacturing a semiconductor device according to claim 8,
    wherein the pulsed laser light is irradiated obliquely to the amorphous semiconductor film.

11. A method for manufacturing a semiconductor device according to claim 8 further comprising the steps of:
    forming a conductive film over the patterned crystalline semiconductor film,
    applying an organic material on the conductive film,
    forming a mask by exposing the organic material, and
    forming a gate electrode by etching the conductive film using the mask,
    wherein the gate electrode is formed between a adjacent ridges.

12. A method for manufacturing a semiconductor device according to claim 8,
    wherein the pulsed laser light is emitted from one or plural lasers selected from the group consisting of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser.

13. A method for manufacturing a semiconductor device according to claim 8,
    wherein a solution including the metal element for promoting the crystallization is added to the amorphous semiconductor film by a spin coat method, a dip method, an ion implantation method, or a sputtering method.

14. A method for manufacturing a semiconductor device according to claim 8,
    wherein the metal containing material for promoting the crystallization comprises a metal selected from the group consisting of Ni, Fe, Co, Pd, Pt, Cu, Au, Ag, In, and Sn.

15. A method for manufacturing a semiconductor device comprising the steps of:
adding a metal containing material for promoting crystallization selectively to an amorphous semiconductor film,
forming a crystalline semiconductor film by heating the amorphous semiconductor film,
forming a grid pattern of a ridge at a grid interval almost equal to an emission wavelength of pulsed laser light by irradiating the pulsed laser light to the crystalline semiconductor film wherein adjacent crystal grains have a same orientation, and
patterning the crystalline semiconductor film so that a channel-forming region of a thin film transistor includes at least one of the crystal grains.

16. A method for manufacturing a semiconductor device according to claim 15,
wherein the crystalline semiconductor film is patterned so that a channel-forming region of the thin film transistor includes the crystal grains with the orientation aligned and does not have a crystal grain boundary of the crystal grain therein.

17. A method for manufacturing a semiconductor device according to claim 15,
wherein the pulsed laser light is irradiated obliquely to the amorphous semiconductor film.

18. A method for manufacturing a semiconductor device according to claim 15 further comprising the steps of:
forming a conductive film over the patterned crystalline semiconductor film,
applying an organic material on the conductive film,
forming a mask by exposing the organic material, and
forming a gate electrode by etching the conductive film using the mask,
wherein the gate electrode is formed between a adjacent ridges.

19. A method for manufacturing a semiconductor device according to claim 15,
wherein the pulsed laser light is emitted from one or plural lasers selected from the group consisting of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser.

20. A method for manufacturing a semiconductor device according to claim 15,
wherein a solution including the metal element for promoting the crystallization is added to the amorphous semiconductor film by a spin coat method, a dip method, an ion implantation method, or a sputtering method.

21. A method for manufacturing a semiconductor device according to claim 15,
wherein the metal containing material for promoting the crystallization comprises a metal selected from the group consisting of Ni, Fe, Co, Pd, Pt, Cu, Au, Ag, In, and Sn.

22. A method for manufacturing a semiconductor device comprising the steps of:
adding a metal containing material for promoting crystallization selectively to an amorphous semiconductor film,
forming a crystalline semiconductor film by heating the amorphous semiconductor film,
forming a grid pattern of a ridge at a grid interval almost equal to an emission wavelength of pulsed laser light by irradiating the pulsed laser light to the crystalline semiconductor film wherein adjacent crystal grains have a same orientation, and
patterning the crystalline semiconductor film so that a channel-forming region of a thin film transistor includes a crystal grain with the orientation aligned and that a capacitance element comprising a semiconductor film not having metal element added is formed.

23. A method for manufacturing a semiconductor device according to claim 22,
wherein the crystalline semiconductor film is patterned so that a channel-forming region of the thin film transistor includes the crystal grains with the orientation aligned and does not have a crystal grain boundary of the crystal grain therein.

24. A method for manufacturing a semiconductor device according to claim 22,
wherein the pulsed laser light is irradiated obliquely to the amorphous semiconductor film.

25. A method for manufacturing a semiconductor device according to claim 22 further comprising the steps of:
forming a conductive film over the patterned crystalline semiconductor film,
applying an organic material on the conductive film,
forming a mask by exposing the organic material, and
forming a gate electrode by etching the conductive film using the mask,
wherein the gate electrode is formed between a adjacent ridges.

26. A method for manufacturing a semiconductor device according to claim 22,
wherein the pulsed laser light is emitted from one or plural lasers selected from the group consisting of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser.

27. A method for manufacturing a semiconductor device according to claim 22,
wherein a solution including the metal element for promoting the crystallization is added to the amorphous semiconductor film by a spin coat method, a dip method, an ion implantation method, or a sputtering method.

28. A method for manufacturing a semiconductor device according to claim 22,
wherein the metal containing material for promoting the crystallization comprises a metal selected from the group consisting of Ni, Fe, Co, Pd, Pt, Cu, Au, Ag, In, and Sn.

29. A method for manufacturing a semiconductor device comprising the steps of:
performing a plasma treatment to an amorphous semiconductor film,
adding a metal containing material for promoting crystallization selectively to the amorphous semiconductor film,
forming a crystalline semiconductor film by heating the amorphous semiconductor film,
forming crystal grains in a grid pattern at an interval almost equal to an emission wavelength of pulsed laser light by irradiating the pulsed laser light to the crystalline semiconductor film wherein adjacent crystal grains have a same orientation, and
patterning the crystalline semiconductor film so that a channel-forming region of a thin film transistor includes at least one of the crystal grains.

30. A method for manufacturing a semiconductor device according to claim 29,
wherein the plasma treatment is performed in such a way that the amorphous semiconductor film is exposed in an atmosphere in which plasma is generated using mainly one or plural gases selected from the group consisting of a noble gas element, nitrogen, and ammonia.

31. A method for manufacturing a semiconductor device according to claim 29,
wherein the crystalline semiconductor film is patterned so that a channel-forming region of the thin film transistor includes the crystal grains with the orientation aligned and does not have a crystal grain boundary of the crystal grain therein.

32. A method for manufacturing a semiconductor device according to claim 29,
wherein the pulsed laser light is irradiated obliquely to the amorphous semiconductor film.

33. A method for manufacturing a semiconductor device according to claim 29 further comprising the steps of:
forming a conductive film over the patterned crystalline semiconductor film,
applying an organic material on the conductive film,
forming a mask by exposing the organic material, and
forming a gate electrode by etching the conductive film using the mask,
wherein the gate electrode is formed between a adjacent ridges.

34. A method for manufacturing a semiconductor device according to claim 29,
wherein the pulsed laser light is emitted from one or plural lasers selected from the group consisting of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser.

35. A method for manufacturing a semiconductor device according to claim 29,
wherein a solution including the metal element for promoting the crystallization is added to the amorphous semiconductor film by a spin coat method, a dip method, an ion implantation method, or a sputtering method.

36. A method for manufacturing a semiconductor device according to claim 29,
wherein the metal containing material for promoting the crystallization comprises a metal selected from the group consisting of Ni, Fe, Co, Pd, Pt, Cu, Au, Ag, In, and Sn.

37. A method for manufacturing a semiconductor device comprising the steps of:
performing a plasma treatment to an amorphous semiconductor film,
adding a metal containing material for promoting crystallization selectively to the amorphous semiconductor film,
forming a crystalline semiconductor film by heating the amorphous semiconductor film,
forming a crystal grain in a grid pattern at an interval almost equal to an emission wavelength of pulsed laser light by irradiating the pulsed laser light to the crystalline semiconductor film wherein adjacent crystal grains have a same orientation, and
patterning the crystalline semiconductor film so that a channel-forming region of a thin film transistor includes a crystal grain with the orientation aligned and that a capacitance element comprising a semiconductor film with no metal element added is formed.

38. A method for manufacturing a semiconductor device according to claim 37,
wherein the plasma treatment is performed in such a way that the amorphous semiconductor film is exposed in an atmosphere in which plasma is generated using mainly one or plural gases selected from the group consisting of a noble gas element, nitrogen, and ammonia.

39. A method for manufacturing a semiconductor device according to claim 37,
wherein the crystalline semiconductor film is patterned so that a channel-forming region of the thin film transistor includes the crystal grains with the orientation aligned and does not have a crystal grain boundary of the crystal grain therein.

40. A method for manufacturing a semiconductor device according to claim 37,
wherein the pulsed laser light is irradiated obliquely to the amorphous semiconductor film.

41. A method for manufacturing a semiconductor device according to claim 37 further comprising the steps of:
forming a conductive film over the patterned crystalline semiconductor film,
applying an organic material on the conductive film,
forming a mask by exposing the organic material, and
forming a gate electrode by etching the conductive film using the mask,
wherein the gate electrode is formed between a adjacent ridges.

42. A method for manufacturing a semiconductor device according to claim 37,
wherein the pulsed laser light is emitted from one or plural lasers selected from the group consisting of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser.

43. A method for manufacturing a semiconductor device according to claim 37,
wherein a solution including the metal element for promoting the crystallization is added to the amorphous semiconductor film by a spin coat method, a dip method, an ion implantation method, or a sputtering method.

44. A method for manufacturing a semiconductor device according to claim 37,
wherein the metal containing material for promoting the crystallization comprises a metal selected from the group consisting of Ni, Fe, Co, Pd, Pt, Cu, Au, Ag, In, and Sn.

* * * * *